United States Patent
Koyama et al.

(10) Patent No.: US 9,443,888 B2
(45) Date of Patent: Sep. 13, 2016

(54) METHOD OF MANUFACTURING SEMICONDUCTOR DEVICE INCLUDING TRANSISTOR AND RESISTOR INCORPORATING HYDROGEN IN OXIDE SEMICONDUCTOR

(71) Applicant: Semiconductor Energy Laboratory Co., Ltd., Atsugi-shi, Kanagawa-ken (JP)

(72) Inventors: Jun Koyama, Sagamihara (JP); Junichiro Sakata, Atsugi (JP); Tetsunori Maruyama, Atsugi (JP); Yuki Imoto, Atsugi (JP); Yuji Asano, Atsugi (JP); Junichi Koezuka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 72 days.

(21) Appl. No.: 14/461,938

(22) Filed: Aug. 18, 2014

(65) Prior Publication Data

US 2014/0357019 A1    Dec. 4, 2014

Related U.S. Application Data

(62) Division of application No. 12/641,446, filed on Dec. 18, 2009, now Pat. No. 9,202,827.

(30) Foreign Application Priority Data

Dec. 24, 2008 (JP) ................... 2008-327998

(51) Int. Cl.
  *H01L 27/12*   (2006.01)
  *H01L 29/786*  (2006.01)

(52) U.S. Cl.
  CPC ............ *H01L 27/127* (2013.01); *H01L 27/12* (2013.01); *H01L 27/1225* (2013.01); *H01L 27/1255* (2013.01); *H01L 29/7869* (2013.01); *H01L 29/78606* (2013.01)

(58) Field of Classification Search
  CPC . H01L 27/127; H01L 27/12; H01L 27/1225; H01L 27/1255; H01L 29/7869; H01L 29/78606
  See application file for complete search history.

(56) References Cited

U.S. PATENT DOCUMENTS 5,403,762 A    4/1995  Takemura
5,403,772 A    4/1995  Zhang et al.
(Continued)

FOREIGN PATENT DOCUMENTS

CN    101325202 A    12/2008
EP      1737044 A    12/2006
(Continued)

OTHER PUBLICATIONS

Taiwanese Office Action (Application No. 102115027) Dated Jan. 27, 2015.
(Continued)

*Primary Examiner* — Minh-Loan Tran
*Assistant Examiner* — Farid Khan
(74) *Attorney, Agent, or Firm* — Robinson Intellectual Property Law Office; Eric J. Robinson

(57) ABSTRACT

The silicon nitride layer 910 formed by plasma CVD using a gas containing a hydrogen compound such as silane ($SiH_4$) and ammonia ($NH_3$) is provided on and in direct contact with the oxide semiconductor layer 905 used for the resistor 354, and the silicon nitride layer 910 is provided over the oxide semiconductor layer 906 used for the thin film transistor 355 with the silicon oxide layer 909 serving as a barrier layer interposed therebetween. Therefore, a higher concentration of hydrogen is introduced into the oxide semiconductor layer 905 than into the oxide semiconductor layer 906. As a result, the resistance of the oxide semiconductor layer 905 used for the resistor 354 is made lower than that of the oxide semiconductor layer 906 used for the thin film transistor 355.

20 Claims, 28 Drawing Sheets

(56) References Cited

U.S. PATENT DOCUMENTS

| | | |
|---|---|---|
| 5,563,426 A | 10/1996 | Zhang et al. |
| 5,572,046 A | 11/1996 | Takemura |
| 5,604,360 A | 2/1997 | Zhang et al. |
| 5,731,856 A | 3/1998 | Kim et al. |
| 5,744,864 A | 4/1998 | Cillessen et al. |
| 5,847,410 A | 12/1998 | Nakajima |
| 5,888,857 A | 3/1999 | Zhang et al. |
| 6,140,165 A | 10/2000 | Zhang et al. |
| 6,140,198 A * | 10/2000 | Liou ............... H01L 27/11 257/E21.006 |
| 6,191,452 B1 | 2/2001 | Oda et al. |
| 6,294,274 B1 | 9/2001 | Kawazoe et al. |
| 6,323,071 B1 | 11/2001 | Zhang et al. |
| 6,338,991 B1 | 1/2002 | Zhang et al. |
| 6,413,805 B1 | 7/2002 | Zhang et al. |
| 6,479,331 B1 | 11/2002 | Takemura |
| 6,555,419 B2 | 4/2003 | Oda et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,806,125 B2 | 10/2004 | Zhang et al. |
| 6,867,075 B2 | 3/2005 | Oda et al. |
| 6,872,605 B2 | 3/2005 | Takemura |
| 6,875,628 B1 | 4/2005 | Zhang et al. |
| 6,960,812 B2 | 11/2005 | Yamazaki et al. |
| 6,987,283 B2 | 1/2006 | Zhang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,230,316 B2 | 6/2007 | Yamazaki et al. |
| 7,238,558 B2 | 7/2007 | Takemura |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,391,051 B2 | 6/2008 | Zhang et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,550,328 B2 | 6/2009 | Kunii |
| 7,601,984 B2 | 10/2009 | Sano et al. |
| 7,602,456 B2 * | 10/2009 | Tanaka ............... G02F 1/13458 349/42 |
| 7,622,335 B2 | 11/2009 | Zhang et al. |
| 7,674,650 B2 | 3/2010 | Akimoto et al. |
| 7,700,418 B2 | 4/2010 | Kunii |
| 7,732,819 B2 | 6/2010 | Akimoto et al. |
| 7,804,091 B2 | 9/2010 | Takechi et al. |
| 7,855,379 B2 | 12/2010 | Hayashi et al. |
| 7,858,451 B2 | 12/2010 | Maekawa et al. |
| 7,863,607 B2 | 1/2011 | Lee et al. |
| 7,939,822 B2 | 5/2011 | Maekawa et al. |
| 7,943,930 B2 | 5/2011 | Zhang et al. |
| 7,998,372 B2 | 8/2011 | Yano et al. |
| 8,026,152 B2 | 9/2011 | Yamazaki et al. |
| 8,062,935 B2 | 11/2011 | Zhang et al. |
| 8,088,652 B2 | 1/2012 | Hayashi et al. |
| 8,102,476 B2 | 1/2012 | Son et al. |
| 8,143,115 B2 | 3/2012 | Omura et al. |
| 8,148,721 B2 | 4/2012 | Hayashi et al. |
| 8,158,974 B2 | 4/2012 | Yano et al. |
| 8,164,256 B2 | 4/2012 | Sano et al. |
| 8,207,533 B2 | 6/2012 | Maekawa et al. |
| 8,232,124 B2 | 7/2012 | Takechi et al. |
| 8,247,814 B2 | 8/2012 | Maekawa et al. |
| 8,278,660 B2 | 10/2012 | Zhang et al. |
| 8,415,198 B2 | 4/2013 | Itagaki et al. |
| 8,436,349 B2 | 5/2013 | Sano et al. |
| 8,441,102 B2 | 5/2013 | Yamazaki et al. |
| 8,476,625 B2 | 7/2013 | Kimura |
| 8,541,944 B2 | 9/2013 | Sano et al. |
| 8,575,618 B2 | 11/2013 | Maekawa et al. |
| 8,742,421 B2 | 6/2014 | Yamazaki et al. |
| 8,803,768 B2 | 8/2014 | Kimura et al. |
| 9,130,049 B2 | 9/2015 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218221 A1 | 11/2003 | Wager, III et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170067 A1 | 8/2006 | Maekawa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 * | 3/2007 | Akimoto ............ H01L 27/1225 438/795 |
| 2007/0090365 A1 | 4/2007 | Hayashi et al. |
| 2007/0108446 A1 | 5/2007 | Akimoto |
| 2007/0115219 A1 | 5/2007 | Inoue |
| 2007/0141784 A1 | 6/2007 | Wager, III et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 * | 3/2008 | Endo ............... H01L 21/265 257/43 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158217 A1 | 7/2008 | Hata et al. |
| 2008/0166475 A1 * | 7/2008 | Jeong ............... H01L 29/7869 427/126.3 |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0191332 A1 | 8/2008 | Koyama et al. |
| 2008/0203387 A1 | 8/2008 | Kang et al. |
| 2008/0213927 A1 | 9/2008 | Wang et al. |
| 2008/0224133 A1 | 9/2008 | Park et al. |
| 2008/0254569 A1 | 10/2008 | Hoffman et al. |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0303020 A1 | 12/2008 | Shin et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0065771 A1* | 3/2009 | Iwasaki ............ H01L 29/78618 257/43 |
| 2009/0068773 A1 | 3/2009 | Lai et al. |
| 2009/0073325 A1 | 3/2009 | Kuwabara et al. |
| 2009/0101895 A1 | 4/2009 | Kawamura et al. |
| 2009/0114910 A1 | 5/2009 | Chang |
| 2009/0114911 A1 | 5/2009 | Maekawa et al. |
| 2009/0134399 A1 | 5/2009 | Sakakura et al. |
| 2009/0141203 A1* | 6/2009 | Son ................... G02F 1/136213 349/39 |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0237000 A1 | 9/2009 | Inoue |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0051937 A1 | 3/2010 | Kaji et al. |
| 2010/0065837 A1* | 3/2010 | Omura ................ H01L 29/7869 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117073 A1* | 5/2010 | Yamazaki ......... H01L 29/66742 257/43 |
| 2011/0032435 A1 | 2/2011 | Kimura |
| 2012/0168748 A1 | 7/2012 | Yano et al. |
| 2012/0168750 A1 | 7/2012 | Hayashi et al. |
| 2014/0346506 A1 | 11/2014 | Kimura et al. |
| 2015/0325707 A1 | 11/2015 | Sano et al. |

FOREIGN PATENT DOCUMENTS

| | | |
|---|---|---|
| EP | 1918904 A | 5/2008 |
| EP | 1939842 A | 7/2008 |
| EP | 2226847 A | 9/2010 |
| EP | 2579237 A | 4/2013 |
| GB | 2425401 | 10/2006 |
| JP | 59-009959 A | 1/1984 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 04-100270 A | 4/1992 |
| JP | 05-198806 A | 8/1993 |
| JP | 05-251705 A | 9/1993 |
| JP | 07-104312 A | 4/1995 |
| JP | 07-226373 A | 8/1995 |
| JP | 08-264794 A | 10/1996 |
| JP | 09-186332 A | 7/1997 |
| JP | 10-242474 A | 9/1998 |
| JP | 11-111994 A | 4/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-158304 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-221570 A | 8/2004 |
| JP | 2004-273614 A | 9/2004 |
| JP | 2004-273732 A | 9/2004 |
| JP | 2005-077822 A | 3/2005 |
| JP | 2005-167212 A | 6/2005 |
| JP | 2006-128666 A | 5/2006 |
| JP | 2006-163507 A | 6/2006 |
| JP | 2006-165532 A | 6/2006 |
| JP | 2007-096055 A | 4/2007 |
| JP | 2007-115808 A | 5/2007 |
| JP | 2007-123861 A | 5/2007 |
| JP | 2007-142195 A | 6/2007 |
| JP | 2007-194594 A | 8/2007 |
| JP | 2007-194628 A | 8/2007 |
| JP | 2007-220817 A | 8/2007 |
| JP | 2007-250983 A | 9/2007 |
| JP | 2008-040343 A | 2/2008 |
| JP | 2008-053356 A | 3/2008 |
| JP | 2008-060419 A | 3/2008 |
| JP | 2008-134625 A | 6/2008 |
| JP | 2008-141119 A | 6/2008 |
| JP | 2008-217778 A | 9/2008 |
| JP | 2008-218495 A | 9/2008 |
| JP | 2008-294136 A | 12/2008 |
| KR | 2006-0089144 A | 8/2006 |
| KR | 2006-0113745 A | 11/2006 |
| KR | 2007-0111975 A | 11/2007 |
| KR | 2008-0047179 A | 5/2008 |
| TW | 200730985 | 8/2007 |
| TW | 200838302 | 9/2008 |
| TW | 200847297 | 12/2008 |
| TW | 200847421 | 12/2008 |
| TW | 200847441 | 12/2008 |
| WO | WO-2004/114391 | 12/2004 |
| WO | WO-2005/055178 | 6/2005 |
| WO | WO-2006/051993 | 5/2006 |
| WO | WO-2007/119386 | 10/2007 |
| WO | WO-2008/023553 | 2/2008 |
| WO | WO-2008/069056 | 6/2008 |
| WO | WO-2008/069255 | 6/2008 |
| WO | WO-2008/069286 | 6/2008 |
| WO | WO-2008/105250 | 9/2008 |
| WO | WO-2008/105347 | 9/2008 |
| WO | WO-2008/117739 | 10/2008 |
| WO | WO-2008/133345 | 11/2008 |
| WO | WO-2011/148537 | 12/2011 |

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Search Report (Application No. 09178444.7) Dated Feb. 15, 2010.

Nakamura.M et al., "Syntheses and crystal structures of new homologous compounds, indium iron zinc oxides ($InFeO_3(ZnO)m$)

(56) References Cited

OTHER PUBLICATIONS (m natural number) and related compounds", Kotai Butsuri (Solid State Physics), 1993, vol. 28, No. 5, pp. 317-327.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium—Gallium—Zinc Oxide TFTs Array", SID Digets '08 : SID International Symposium Digets of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2: AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digets of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Parks et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No, 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] At Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Nakamura.M, "Synthesis of Homologous Compound with New Long-Period Structure", Nirim Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Orita.M et al., "Mechanism of Electrical Conductivity of Transparent InGaZnO4", Phys. Rev, B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using Castep", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S at al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Chinese Office Action (Application No. 200910262579.8) Dated Jun. 4, 2013.
Taiwanese Office Action (Application No. 98143361) Dated Jul. 24, 2014.
Chinese Office Action (Application No. 201410329038.3) Dated Jun. 12, 2016.
Chinese Office Action (Application No. 201410329040.0) Dated May 23, 2016.

\* cited by examiner

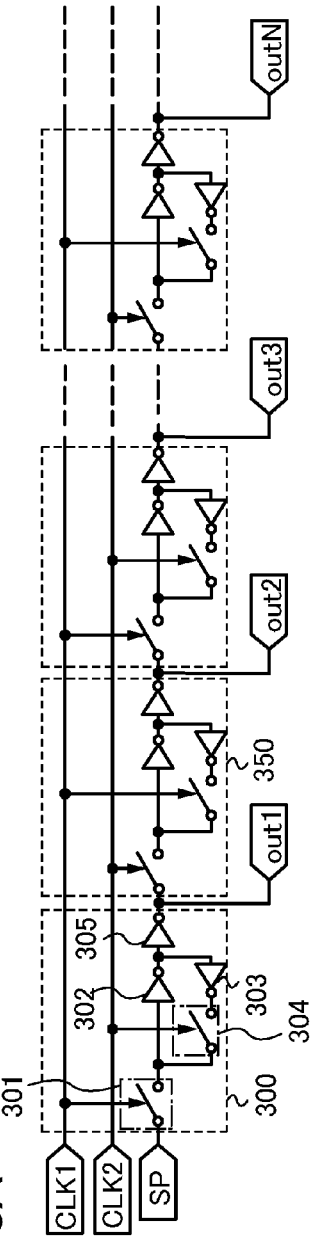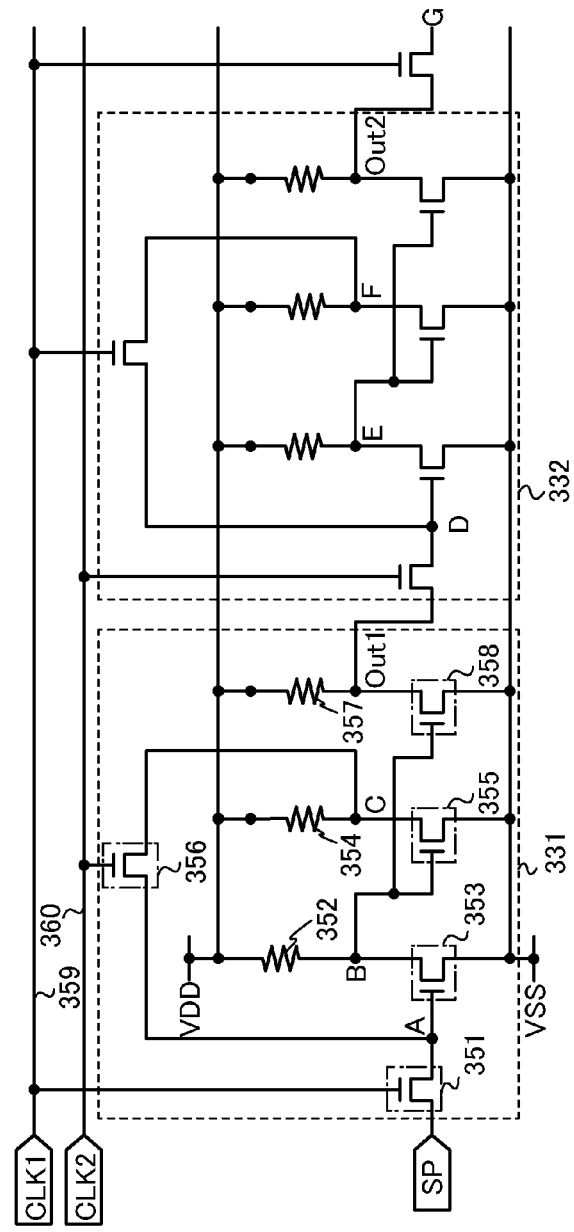
FIG. 3A
FIG. 3B

METHOD OF MANUFACTURING SEMICONDUCTOR DEVICE INCLUDING TRANSISTOR AND RESISTOR INCORPORATING HYDROGEN IN OXIDE SEMICONDUCTOR

BACKGROUND OF THE INVENTION

1. Field of the Invention

The present invention relates to a driver circuit including an element that is formed using a metal oxide exhibiting semiconductor characteristics, and to a semiconductor device using the driver circuit. Note that the semiconductor device indicates all the devices that can operate by using semiconductor characteristics, and display devices, semiconductor circuits, and electronic appliances are all included in the category of the semiconductor devices.

2. Description of the Related Art

A wide variety of metal oxides exist and are used for various applications. Indium oxide is a well-known material and is used as a transparent electrode material needed for a liquid crystal display and the like.

Some metal oxides exhibit semiconductor characteristics. Metal oxides exhibiting semiconductor characteristics are a kind of compound semiconductor. The compound semiconductor is a semiconductor obtained by bonding two or more kinds of atoms. In general, metal oxides are insulators; however, it is known that metal oxides become semiconductors depending on the combination of elements included in the metal oxides.

For example, it is known that some metal oxides such as tungsten oxide, tin oxide, indium oxide, and zinc oxide exhibit semiconductor characteristics. References disclose a thin film transistor in which a transparent semiconductor layer including such a metal oxide is used as a channel formation region (Patent Documents 1 to 4, and Non-Patent Document 1).

As metal oxides, multi-component oxides as well as single-component oxides are known. For example, $InGaO_3(ZnO)_m$ (m is a natural number) belonging to homologous series is a known material (Non-Patent Documents 2 to 4).

In addition, it has been confirmed that such an In—Ga—Zn-based oxide can be used for a channel formation region of a thin film transistor (Patent Document 5, and Non-Patent Documents 5 and 6).

REFERENCES

Patent Document

[Patent Document 1] Japanese Patent Laid-Open No. S60-198861
[Patent Document 2] Japanese Patent Laid-Open No. H8-264794
[Patent Document 3] Japanese Translation of PCT International Application No. H11-505377
[Patent Document 4] Japanese Patent Laid-Open No. 2000-150900
[Patent Document 5] Japanese Patent Laid-Open No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor" (Appl. Phys. Lett., 17 Jun. 1996, Vol. 68, pp. 3650-3652)
[Non-Patent Document 2] M. Nakamura, N. Kimizuka, and T. Mohri, "The Phase Relations in the $In_2O_3$—$Ga_2ZnO_4$—ZnO System at 1350° C." (J. Solid State Chem., 1991, Vol. 93, pp. 298-315)
[Non-Patent Document 3] N. Kimizuka, M. Isobe, and M. Nakamura, "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO system" (J. Solid State Chem., 1995, Vol. 116, p. 170-178)
[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound" (KOTAI BUTSURI (SOLID STATE PHYSICS), 1993, Vol. 28, No. 5, pp. 317-327)
[Non-Patent Document 5] K. Nomura, H. Ohta, K. Ueda, T. Kamiya, M. Hirano, and H. Hosono, "Thin-film transistor fabricated in single-crystalline transparent oxide semiconductor" (SCIENCE, 2003, Vol. 300, p. 1269-1272)
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors" (NATURE, 2004, Vol. 432, pp. 488-492)

SUMMARY OF THE INVENTION

Application of a thin film transistor using a metal oxide exhibiting semiconductor characteristics (hereinafter, also referred to as an oxide semiconductor) to an active matrix display device (such as a liquid crystal display, an electroluminescence display, or electronic paper) has been taken into consideration. An active matrix display device includes several hundreds of thousands to several millions of pixels arranged in a matrix and a driver circuit for inputting pulse signals to the pixels.

In an active matrix display device, a thin film transistor is provided in each pixel and serves as a switching element for switching on or off when a pulse signal is input from a driver circuit, so that images can be displayed. The thin film transistor is also used as an element forming a driver circuit.

A driver circuit for driving a pixel portion includes elements such as a thin film transistor, a capacitor, and a resistor.

An object of one embodiment of the present invention is to provide a driver circuit including an active element and a passive element that are manufactured using an oxide semiconductor, and a semiconductor device including the driver circuit.

One embodiment of the present invention includes an enhancement-mode thin film transistor and a resistor. The thin film transistor and the resistor are formed using an oxide semiconductor layer. In addition, the concentration of hydrogen in the oxide semiconductor layer used for the thin film transistor is made lower than that in the oxide semiconductor layer used for the resistor. Accordingly, the oxide semiconductor layer used for the resistor has a lower resistance than the oxide semiconductor layer used for the thin film transistor.

One embodiment of the present invention includes a thin film transistor and a resistor that are formed using an oxide semiconductor layer. A silicon nitride layer formed by plasma CVD using a gas containing a hydrogen compound such as silane ($SiH_4$) and ammonia ($NH_3$) is formed on and in direct contact with the oxide semiconductor layer used for the resistor, and the silicon nitride layer is formed over the oxide semiconductor layer used for the thin film transistor with a silicon oxide layer serving as a barrier layer interposed therebetween. Therefore, a higher concentration of hydrogen is introduced into the oxide semiconductor layer used for the resistor than into the oxide semiconductor layer used for the thin film transistor. As a result, the oxide semiconductor layer used for the resistor has a lower resistance than the oxide semiconductor layer used for the thin film transistor.

That is, one embodiment of the present invention is a driver circuit including a resistor in which a first oxide semiconductor layer is used for a resistor element, a thin film transistor in which a second oxide semiconductor layer having a lower concentration of hydrogen than the first oxide semiconductor layer is used for a channel formation region, a silicon oxide layer provided over the second oxide semiconductor layer, and a silicon nitride layer provided over the first oxide semiconductor layer and the silicon oxide layer.

According to one embodiment of the present invention, an oxide semiconductor layer having a low resistance may be provided between the oxide semiconductor layers that are used for the resistor element of the resistor and the channel formation region of the thin film transistor, and a wiring that is a conductor.

That is, according to one embodiment of the present invention, the driver circuit having the aforementioned structure includes a third oxide semiconductor layer in contact with one terminal or the other terminal of the resistor and the first oxide semiconductor layer; a fourth oxide semiconductor layer in contact with a first terminal of the thin film transistor and the second oxide semiconductor layer; and a fifth oxide semiconductor layer in contact with a second terminal of the thin film transistor and the second oxide semiconductor layer. The resistance of each of the third oxide semiconductor layer to the fifth oxide semiconductor layer is lower than that of the second oxide semiconductor layer.

In addition, a driver circuit of one embodiment of the present invention includes a resistor and a thin film transistor that are formed using an oxide semiconductor layer containing a high concentration of nitrogen. Furthermore, a silicon oxide layer serving as a barrier layer is provided over the thin film transistor. At this time, heat treatment is performed at 200° C. to 600° C., typically 250° C. to 500° C. in an atmosphere containing a substance which is a supply source of a hydrogen atom. Nitrogen in the oxide semiconductor layer has the effect of preventing atoms forming the oxide semiconductor layer from tightly filling the film, and of promoting diffusion and solid dissolution of hydrogen in the film. Accordingly, the heat treatment allows a higher concentration of hydrogen to be introduced into the oxide semiconductor layer used for the resistor and containing a high concentration of nitrogen than into the oxide semiconductor layer used for the thin film transistor. As a result, the resistance of the oxide semiconductor layer used for the resistor and containing a high concentration of nitrogen is lower than that of the oxide semiconductor layer used for the thin film transistor and containing a high concentration of nitrogen.

That is, the driver circuit of one embodiment of the present invention includes a resistor in which a first oxide semiconductor layer containing a high concentration of nitrogen is used for a resistor element, and a thin film transistor in which a second oxide semiconductor layer containing a high concentration of nitrogen and a lower concentration of hydrogen than the first oxide semiconductor layer is used for a channel formation region.

Note that the oxide semiconductor layer containing a high concentration of nitrogen refers to an oxide semiconductor layer with a ratio of nitrogen (N) to oxygen (O) (N/O) of 0.05 to 0.8, preferably 0.1 to 0.5.

Furthermore, according to one embodiment of the present invention, a silicon nitride layer formed by plasma CVD using a gas containing a hydrogen compound such as silane ($SiH_4$) and ammonia ($NH_3$) is provided on and in direct contact with the oxide semiconductor layer used for the resistor and containing a high concentration of nitrogen.

That is, according to one embodiment of the present invention, the driver circuit having the aforementioned structure includes a silicon oxide layer provided over the second oxide semiconductor layer, and a silicon nitride layer provided over the first oxide semiconductor layer and the silicon oxide layer.

In this document (specification, claims, drawings, and the like), the word "film" means something formed on the entire surface of a substrate to be processed into a desired shape in a subsequent photolithography step or the like, and something before the processing. The word "layer" means something obtained by processing and shaping a "film" into a desired shape by a photolithography step or the like, or something that is to be formed on the entire surface of a substrate.

Also in this document (specification, claims, drawings, and the like), the phrase "A and B are connected" means that A and B are electrically connected, as well as that A and B are directly connected. Here, the phrase "A and B are electrically connected" shows that, when an electrically acting object exists between A and B, A and B are at substantially the same potential through the object.

Specifically, the phrase "A and B are connected" means the case where A and B can be regarded to be at the same node in consideration of the circuit operation, such as the case where A and B are connected through a switching element such as a transistor and have substantially the same potential through the conduction of the switching element, and the case where A and B are connected through a resistor and a potential difference between the two ends of the resistor does not affect the operation of a circuit including A and B.

Note that it is difficult to determine which one of the terminals of a thin film transistor is a source terminal or a drain terminal because it changes depending on the structure, operating conditions, and the like of the thin film transistor. Therefore, in this document (specification, claims, drawings, and the like), one of a source terminal and a drain terminal is referred to as a first terminal and the other thereof is referred to as a second terminal for distinction.

According to one embodiment of the present invention, the concentration of hydrogen in an oxide semiconductor layer used for a resistor element of a resistor can be made higher than that in an oxide semiconductor layer used for a channel formation region of a thin film transistor. Therefore, the resistance of an oxide semiconductor layer can be selectively lowered. Accordingly, a thin film transistor and a resistor do not need to be manufactured in different steps, which makes it possible to provide a driver circuit manufactured in a smaller number of steps and a semiconductor device including the driver circuit.

BRIEF DESCRIPTION OF THE DRAWINGS

In the accompanying drawings:

FIGS. 3A and 3B are circuit diagrams illustrating an example of a structure of a driver circuit;

DETAILED DESCRIPTION OF THE INVENTION

Figure 1:
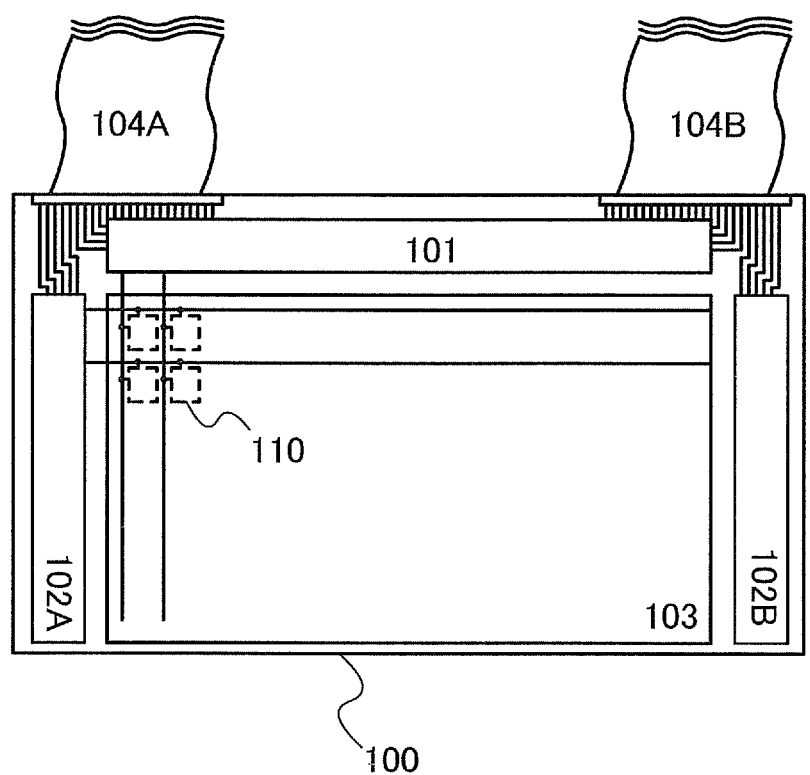
FIG. 1 is a diagram illustrating an example of a structure of a semiconductor device.

Embodiments of the disclosed invention will be described below with reference to drawings. Note that the disclosed invention is not limited to the following embodiments, and it is apparent to those skilled in the art that modes and details can be modified in a wide variety of ways without departing from the spirit and scope of the disclosed invention. Accordingly, the disclosed invention should not be construed as being limited to the description of the embodiments given below. Note that in the embodiments shown below, like portions are denoted by like reference numerals in different drawings in some cases.

Embodiment 1

In this embodiment, an example of a display device including a driver circuit manufactured using an oxide semiconductor will be described with reference to FIGS. 1 and 2, FIGS. 3A and 3B, FIG. 4, FIGS. 5A to 5C, FIGS. 6A to 6C, FIGS. 7 to 10, FIGS. 11A to 11C, FIGS. 12A and 12B, FIGS. 13A and 13B, FIGS. 14A and 14B, FIGS. 15A to 15C, and FIGS. 16A to 16C. Specifically, a driver circuit having an inverter formed by a combination of an enhancement-mode thin film transistor and a resistor (hereinafter, referred to as an ERMOS circuit) will be described as an example of a source line driver circuit and a gate line driver circuit that are driver circuits for driving a pixel portion of a display device. Note that in this embodiment, an n-channel thin film transistor is used as a thin film transistor forming a unipolar driver circuit.

Note that a display device refers to a device including a display element such as a light-emitting element or a liquid crystal element. The display device may include a peripheral driver circuit for driving a plurality of pixels. The peripheral driver circuit for driving a plurality of pixels is formed over the same substrate as the plurality of pixels. The display device may include a flexible printed circuit (FPC). Furthermore, the display device may include a printed wiring board (PWB) which is connected to the display device through a flexible printed circuit (FPC) or the like and to which an IC chip, a resistor, a capacitor, an inductor, a transistor, and the like are attached. The display device may further include an optical sheet such as a polarizing plate or a retardation plate, a lighting device, a housing, an audio input/output device, an optical sensor, and the like.

FIG. 1 illustrates an overall view of a display device. A source line driver circuit 101, a first gate line driver circuit 102A, a second gate line driver circuit 102B, and a pixel portion 103 are formed over a substrate 100. In the pixel portion 103, a part surrounded by a dotted frame 110 is one pixel. FIG. 1 illustrates an example where the first gate line driver circuit 102A and the second gate line driver circuit 102B are used as a gate line driver circuit; however, only one of them may be used as a gate line driver circuit. In the pixel of the display device, a display element is controlled by a thin film transistor. Signals (clock signals, start pulses, and the like) for driving the source line driver circuit 101, the first gate line driver circuit 102A, and the second gate line driver circuit 102B are input from the outside via flexible printed circuits (FPCs) 104A and 104B.

The source line driver circuit and the gate line driver circuit for driving the pixel portion have a logic circuit such as an inverter circuit formed with a thin film transistor, a capacitor, a resistor, and the like. As an inverter circuit formed with a unipolar thin film transistor, there are a circuit formed by a combination of an enhancement-mode thin film transistor and a depletion-mode thin film transistor (hereinafter, referred to as an EDMOS circuit), a circuit formed by a combination of enhancement-mode thin film transistors (hereinafter, referred to as an EEMOS circuit), and an ERMOS circuit. Note that an n-channel thin film transistor with a positive threshold voltage is defined as an enhancement-mode transistor while an n-channel thin film transistor with a negative threshold voltage is defined as a depletion-mode transistor, and these definitions apply to this specification.

When an enhancement-mode transistor with a positive threshold voltage is used as a thin film transistor provided in the pixel portion, a current flowing due to a voltage applied between a gate terminal and a source terminal can be made lower than that in the case of using a depletion-mode transistor, resulting in lower power consumption. It is preferable that an enhancement-mode thin film transistor be also used as a thin film transistor in the driver circuit for driving the pixel portion as well as in the pixel portion. By using an enhancement-mode thin film transistor as a thin film transistor of an inverter circuit, the pixel portion and the driver circuit can be manufactured with one kind of transistor, which makes it possible to reduce the number of manufacturing steps. Note that an enhancement-mode transistor uses an oxide semiconductor and has such electric characteristics as an on/off ratio of $10^9$ or more at a gate voltage of $-20$ V to 20 V. Accordingly, a small leakage current flows between a source terminal and a drain terminal, which allows low power consumption driving.

Note that in this document (specification, claims, drawings, and the like), a thin film containing a compound represented by $InMO_3 (ZnO)_m$ ($m>0$) is formed as an oxide semiconductor and the thin film is used for manufacturing a semiconductor element. Note that M denotes one or more of metal elements selected from gallium (Ga), iron (Fe), nickel (Ni), manganese (Mn), and cobalt (Co). For example, M is gallium (Ga) in some cases, and in other cases, M contains other metal elements in addition to gallium (Ga), such as gallium (Ga) and nickel (Ni) or gallium (Ga) and iron (Fe). Furthermore, the above oxide semiconductor may contain a transition metal element such as iron (Fe) or nickel (Ni) or an oxide of the transition metal as an impurity element in addition to a metal element contained as M. In addition, the concentration of sodium (Na) contained in the above oxide semiconductor is $5\times10^{18}$ atoms/cm$^3$ or less, preferably $1\times10^{18}$ atoms/cm$^3$ or less. In this document (specification, claims, drawings, and the like), this thin film is also referred to as an In—Ga—Zn—O-based non-single-crystal film.

Table 1 shows a typical example of measurement by inductively coupled plasma mass spectrometry (ICP-MS). An oxide semiconductor film of $InGa_{0.94}Zn_{0.40}O_{3.31}$ is obtained under Condition 1: a target including $In_2O_3$, $Ga_2O_3$, and ZnO at a molar ratio of 1:1:1 (In:Ga:Zn=1:1:0.5) is used, pressure is 0.4 Pa, direct current (DC) power source is 500 W, the flow rate of argon gas is 10 sccm, and the flow rate of oxygen gas is 5 sccm. Further, an oxide semiconductor film of $InGa_{0.95}Zn_{0.41}O_{3.33}$ is obtained under Condition 2 that is different from Condition 1 only in the deposition atmosphere in which the flow rate of argon gas is changed to 40 sccm and the flow rate of oxygen gas is changed to 0 sccm.

TABLE 1

| flow rate | concentrations (atomic %) | | | | |
|---|---|---|---|---|---|
| Ar/O$_2$ | In | Ga | Zn | O | concentration formula |
| 10/5 | 17.7 | 16.7 | 7 | 58.6 | $InGa_{0.94}Zn_{0.40}O_{3.31}$ |
| 40/0 | 17.6 | 16.7 | 7.2 | 58.6 | $InGa_{0.95}Zn_{0.41}O_{3.33}$ |

In addition, the measurement is performed by Rutherford backscattering spectrometry (RBS) instead of ICP-MS, and the quantified results are shown in Table 2.

TABLE 2

| flow rate | concentrations (atomic %) | | | | | |
|---|---|---|---|---|---|---|
| Ar/O$_2$ | In | Ga | Zn | O | Ar | concentration formula |
| 10/5 | 16 | 14.7 | 7.2 | 61.7 | 0.4 | $InGa_{0.92}Zn_{0.45}O_{3.86}$ |
| 40/0 | 17 | 15.8 | 7.5 | 59.4 | 0.3 | $InGa_{0.93}Zn_{0.44}O_{3.49}$ |

As the result of measurement of the sample in Condition 1 by RBS, an oxide semiconductor film of $InGa_{0.92}Zn_{0.45}O_{3.86}$ is obtained. Further, as the result of measurement of the sample in Condition 2 by RBS, an oxide semiconductor film of $InGa_{0.93}Zn_{0.44}O_{3.49}$ is obtained.

Even when an In—Ga—Zn—O-based non-single-crystal film is deposited by sputtering and then subjected to heat treatment at a temperature of 200° C. to 500° C., typically 300° C. to 400° C. for 10 minutes to 100 minutes, an amorphous structure is observed when its crystal structure is analyzed by X-ray diffraction (XRD). In addition, it is possible to manufacture a thin film transistor having such electric characteristics as an on/off ratio of $10^9$ or more and a mobility of 10 or more at a gate voltage of $-20$ V to 20 V. A thin film transistor manufactured using an oxide semiconductor layer having such electric characteristics has a higher mobility than a thin film transistor manufactured using amorphous silicon, which allows a driver circuit including a shift register to be driven at high speed.

Next, an example of a circuit diagram of a gate line driver circuit and a source line driver circuit using an ERMOS circuit will be illustrated and described.

First, a structure of a source line driver circuit which uses an ERMOS circuit as an inverter circuit will be described.

Figure 2:
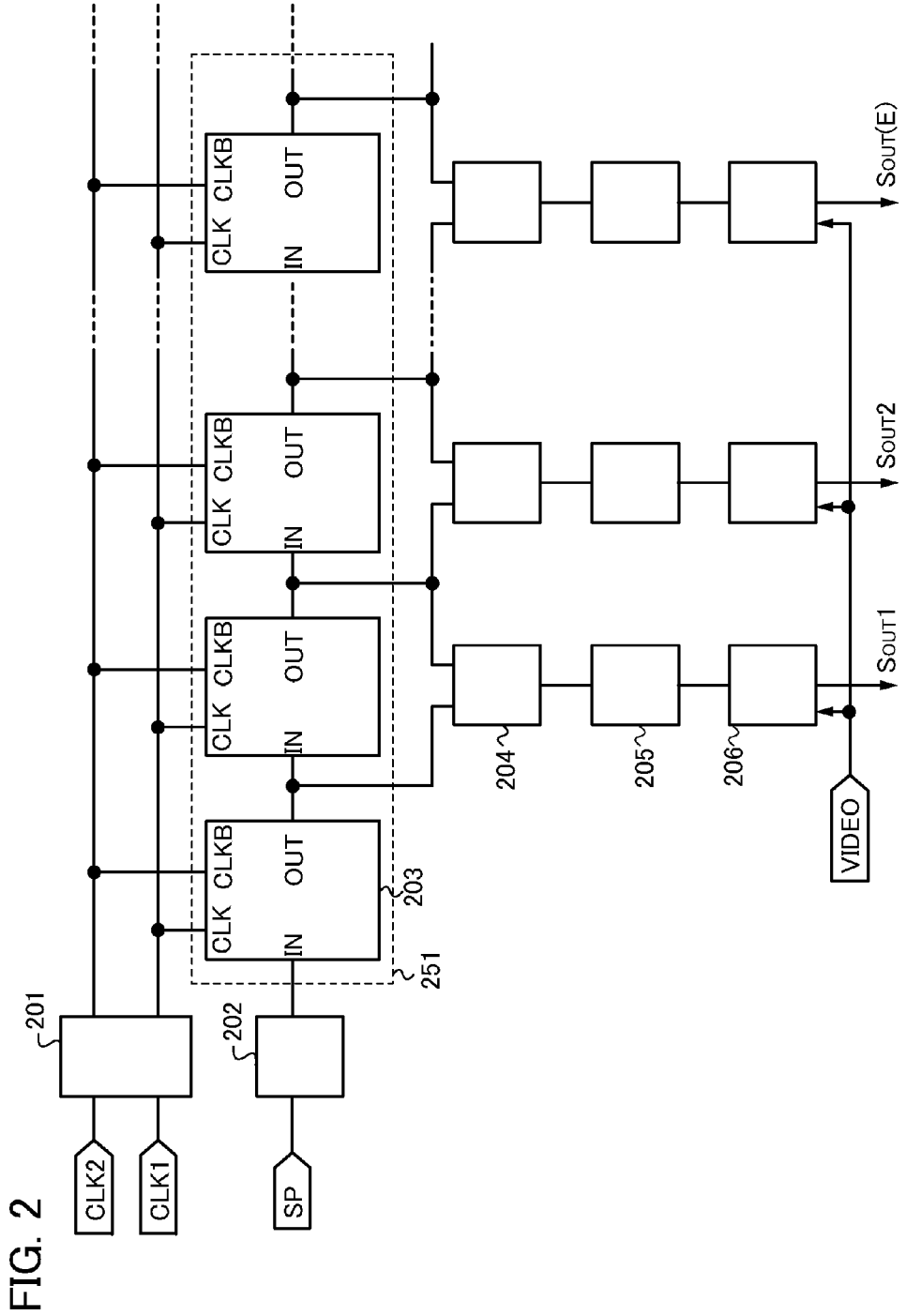
FIG. 2 is a block diagram illustrating an example of a structure of a driver circuit.

FIG. 2 is a diagram illustrating a structure of the source line driver circuit 101 included in the display device illustrated in FIG. 1. The source line driver circuit includes a clock signal level shifter 201, a start pulse level shifter 202, a pulse output circuit 203 which forms a shift register 251, a NAND circuit 204, a buffer 205, and a sampling switch 206. Signals input from the outside are a first clock signal (CLK1), a second clock signal (CLK2), a start pulse (SP), and an analog video signal (Video). Among the signals input from the outside, the amplitude of the first clock signal (CLK1), the second clock signal (CLK2), and the start pulse (SP) is converted by the clock signal level shifter 201 or the start pulse level shifter 202 immediately after they have been input from the outside as signals with low voltage amplitude, and then the signals are input to the driver circuit as signals with high voltage amplitude.

Further, in the source line driver circuit in the display device of this embodiment, a sampling pulse which is output from a pulse output circuit of one stage in the shift register drives the sampling switch 206 to sample analog video signals of 12 source signal lines at the same time. Note that another signal for switching a scanning direction, or the like may be additionally input. Although this embodiment shows an example in which clock signals having two phases, such as a first clock signal (CLK1) and a second clock signal (CLK2), are used for driving the driver circuit, another structure may be employed in which signals other than the clock signals having two phases are input to drive the driver circuit.

FIGS. 3A and 3B illustrate a structure of the plurality of pulse output circuits 203 included in the shift register 251. A pulse output circuit 300 includes a first switch 301 connected to a terminal to which a start pulse SP is input; a first inverter circuit 302 that inverts a signal input through the first switch 301 and outputs the inverted signal; a second inverter circuit 303 and a third inverter circuit 305 that invert a signal output from the first inverter circuit 302 and output the inverted signal; and a second switch 304 connected to a terminal to which a signal output from the second inverter circuit 303 is input.

In the circuit diagram illustrated in FIG. 3A, a block indicated by a dotted line corresponds to a pulse output circuit 350 that outputs a sampling pulse for one stage. The shift register in FIG. 3A includes N-stage (N is a natural number) pulse output circuits. Output signals out1 to outN are output from an output terminal of the third inverter circuit 305 in each of the N-stage pulse output circuits. Note that in the pulse output circuit of the second stage, which is next to the aforementioned first stage, a wiring to which the first clock signal is input and a wiring to which the second clock signal is input are connected to the second switch 304 and the first switch 301, respectively. That is, the connection in the second stage is changed from that in the first stage between the first switch 301 and the second switch 304. In the third stage and thereafter, the connection of the wirings to which the first clock signal and the second clock signal are input is alternately switched between the first switch 301 and the second switch 304.

FIG. 3B illustrates in detail a circuit structure of the pulse output circuit. The pulse output circuit body includes thin film transistors 351, 353, 355, 356, and 358, and resistors 352, 354, and 357. A pulse output circuit 331 of an odd-numbered stage and a pulse output circuit 332 of an even-numbered stage are connected to a wiring 359 for supplying the first clock signal (CLK1) and a wiring 360 for supplying the second clock signal (CLK2). Hereinafter, connection relationship of a semiconductor element will be specifically described using the pulse output circuit 331 of the first stage as an example.

A first terminal of the thin film transistor 351 is connected to a terminal to which a start pulse SP is input, and a gate terminal of the thin film transistor 351 is connected to the wiring 359.

One terminal of the resistor 352 is connected to a wiring to which a high power supply potential VDD is supplied (also referred to as a high potential line).

A first terminal of the thin film transistor 353 is connected to the other terminal of the resistor 352, a gate terminal of the thin film transistor 353 is connected to a second terminal of the thin film transistor 351, and a second terminal of the thin film transistor 353 is connected to a wiring to which a low power supply potential VSS is supplied (also referred to as a low potential line).

One terminal of the resistor 354 is connected to the high potential line.

A first terminal of the thin film transistor 355 is connected to the other terminal of the resistor 354, a gate terminal of the thin film transistor 355 is connected to the other terminal of the resistor 352 and the first terminal of the thin film transistor 353, and a second terminal of the thin film transistor 355 is connected to the low potential line.

A first terminal of the thin film transistor 356 is connected to the other terminal of the resistor 354 and the first terminal of the thin film transistor 355, a gate terminal of the thin film transistor 356 is connected to the wiring 360, and a second terminal of the thin film transistor 356 is connected to the second terminal of the thin film transistor 351 and the gate terminal of the thin film transistor 353.

One terminal of the resistor 357 is connected to the high potential line, and the other terminal thereof is connected to a first terminal of a thin film transistor 351 in the pulse output circuit 332 of the second stage.

A first terminal of the thin film transistor 358 is connected to the other terminal of the resistor 357 and the first terminal of the thin film transistor 351 in the pulse output circuit 332 of the second stage, a gate terminal of the thin film transistor 358 is connected to the other terminal of the resistor 352, the first terminal of the thin film transistor 353, and the gate terminal of the thin film transistor 355, and a second terminal of the thin film transistor 358 is connected to the low potential line.

The pulse output circuit of the second stage has the same structure as that of the first stage except that the connection of the wiring 359 and the connection of the wiring 360 are switched to each other. In the third stage and thereafter, the pulse output circuit 331 of the odd-numbered stage and the pulse output circuit 332 of the even-numbered stage are connected in a manner similar to the pulse output circuit 331 of the first stage and the pulse output circuit 332 of the second stage, respectively.

In FIG. 3B, the thin film transistor 351 corresponds to the first switch 301 illustrated in FIG. 3A. The resistor 352 and the thin film transistor 353 correspond to the first inverter circuit 302 illustrated in FIG. 3A, and the first inverter circuit 302 is an ERMOS circuit. The resistor 354 and the thin film transistor 355 correspond to the second inverter circuit 303 illustrated in FIG. 3A, and the second inverter circuit 303 is an ERMOS circuit. The thin film transistor 356 corresponds to the second switch 304 illustrated in FIG. 3A. The resistor 357 and the thin film transistor 358 correspond to the third inverter circuit 305 illustrated in FIG. 3A, and the third inverter circuit 305 is an ERMOS circuit.

It is preferable that the thin film transistors 351 and 356 be enhancement-mode transistors like the thin film transistors 353, 355, and 358. By using an enhancement-mode transistor as a switch, the off-current of the transistor can be reduced, resulting in lower power consumption and reduction in the number of manufacturing steps.

Here, operation of the circuits illustrated in FIGS. 3A and 3B will be described with reference to a timing chart of FIG. 4. Note that for description of FIG. 4, as the nodes in the pulse output circuit of the first stage illustrated in FIG. 3B, the second terminal of the thin film transistor 351 is referred to as a node A (denoted as A in FIG. 3B and FIG. 4), the other terminal of the resistor 352 is referred to as a node B (denoted as B in FIG. 3B and FIG. 4), the other terminal of the resistor 354 is referred to as a node C (denoted as C in FIG. 3B and FIG. 4), and the other terminal of the resistor 357 is referred to as a node out1 (denoted as out1 in FIG. 3B and FIG. 4).

Figure 4:
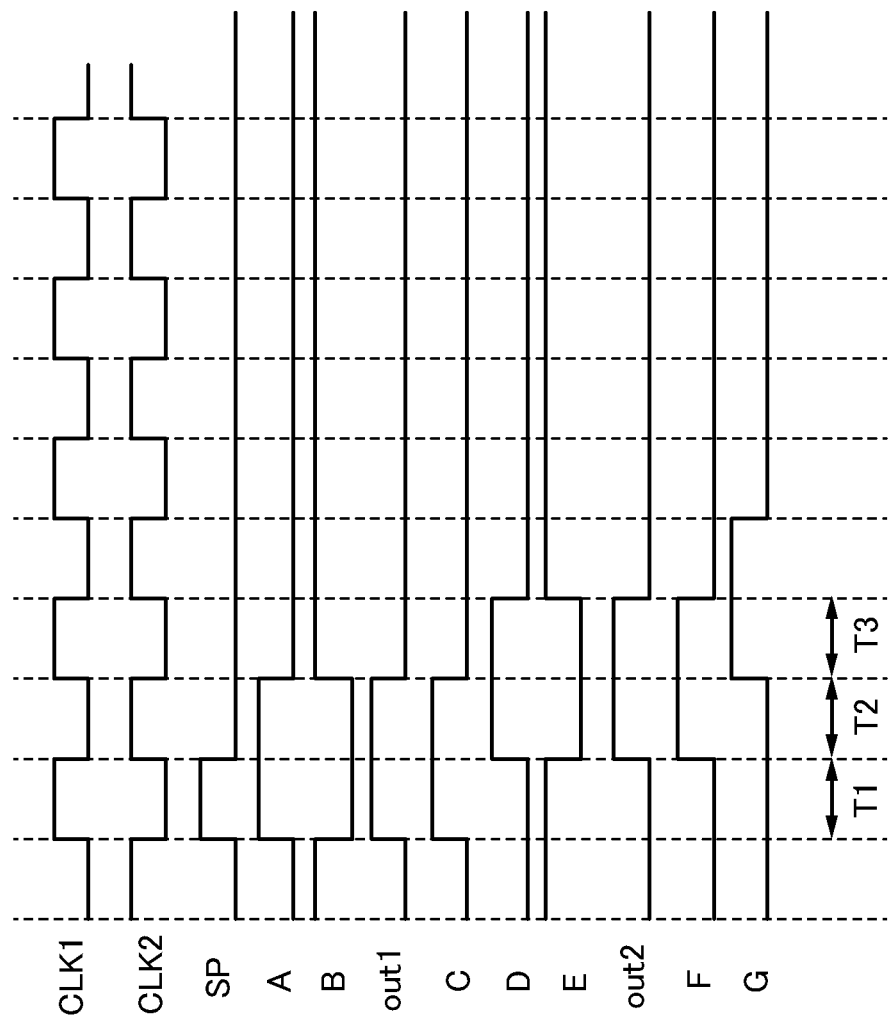
FIG. 4 is an example of a timing chart of a driver circuit.

In addition, as the nodes in the pulse output circuit of the second stage illustrated in FIG. 3B, the second terminal of the thin film transistor 351 is referred to as a node D (denoted as D in FIG. 3B and FIG. 4), the other terminal of the resistor 352 is referred to as a node E (denoted as E in FIG. 3B and FIG. 4), the other terminal of the resistor 354 is referred to as a node F (denoted as F in FIG. 3B and FIG. 4), and the other terminal of the resistor 357 is referred to as a node out2 (denoted as out2 in FIG. 3B and FIG. 4). Furthermore, as the nodes in the pulse output circuit of the third stage illustrated in FIG. 3B, the second terminal of the thin film transistor 351 is referred to as a node G (denoted as G in FIG. 3B and FIG. 4).

Operation in a period T1 in FIG. 4 will be described in which the start pulse SP is at H level, the first clock signal (CLK1) is at H level, and the second clock signal (CLK2) is at L level.

When the first clock signal (CLK1) becomes H level, the thin film transistor 351 in the pulse output circuit of the first stage is turned on.

Then, the voltage at the node A rises to H level due to the start pulse at H level.

When the voltage at the node A rises to H level, the thin film transistor 353 in the pulse output circuit of the first stage is turned on.

Then, the voltage at the node B drops to L level due to the low power supply potential at L level.

When the voltage at the node B drops to L level, the thin film transistor 355 and the thin film transistor 358 in the pulse output circuit of the first stage are turned off.

When the thin film transistor 355 in the pulse output circuit of the first stage is turned off, the voltage at the node C rises to H level due to the high power supply potential at H level. Moreover, when the thin film transistor 358 in the pulse output circuit of the first stage is turned off, the voltage at the node out1 rises to H level due to the high power supply potential at H level.

Note that since the second clock signal (CLK2) is at L level, the thin film transistor 356 in the pulse output circuit of the first stage and the thin film transistor 351 in the pulse output circuit of the second stage are turned off.

Next, operation in a period T2 in FIG. 4 will be described in which the start pulse SP is at L level, the first clock signal (CLK1) is at L level, and the second clock signal is at H level.

When the first clock signal becomes L level, the thin film transistor 351 in the pulse output circuit of the first stage is turned off. On the other hand, the thin film transistor 356 in the pulse output circuit of the first stage is turned on because the second clock signal (CLK2) is at H level. Accordingly, the voltage at the node A is kept at H level due to the voltage at the node C which is at H level in the period T1.

Thus, each of the nodes in the pulse output circuit of the first stage is kept at the same level as in the period T1.

On the other hand, since the second clock signal (CLK2) retains H level, the thin film transistor 351 in the pulse output circuit of the second stage is turned on.

Then, the voltage at the node D rises to H level due to the voltage at the node out1 which is at H level.

When the voltage at the node D rises to H level, the thin film transistor 353 in the pulse output circuit of the second stage is turned on.

Then, the voltage at the node E drops to L level due to the low power supply potential at L level.

When the voltage at the node E drops to L level, the thin film transistor 355 and the thin film transistor 358 in the pulse output circuit of the second stage are turned off.

When the thin film transistor 355 in the pulse output circuit of the second stage is turned off, the voltage at the node F rises to H level due to the high power supply potential at H level. Moreover, when the thin film transistor 358 in the pulse output circuit of the second stage is turned off, the voltage at the node out2 rises to H level due to the high power supply potential at H level.

Note that since the first clock signal (CLK1) is at L level, the thin film transistor 356 in the pulse output circuit of the second stage and the thin film transistor 351 in the pulse output circuit of the third stage are turned off.

Next, operation in a period T3 in FIG. 4 will be described in which the start pulse SP is at L level, the first clock signal (CLK1) is at H level, and the second clock signal is at L level.

When the first clock signal retains H level, the thin film transistor 351 in the pulse output circuit of the first stage is turned on. On the other hand, the thin film transistor 356 in the pulse output circuit of the first stage is turned off due to the second clock signal (CLK2) at L level. Accordingly, the voltage at the node A drops to L level.

When the voltage at the node A drops to L level, the thin film transistor 353 in the pulse output circuit of the first stage is turned off.

Then, the voltage at the node B rises to H level due to the high power supply potential at H level.

When the voltage at the node B rises to H level, the thin film transistor 355 and the thin film transistor 358 in the pulse output circuit of the first stage are turned off.

When the thin film transistor 355 in the pulse output circuit of the first stage is turned on, the voltage at the node C drops to L level due to the low power supply potential at L level. Moreover, when the thin film transistor 358 in the pulse output circuit of the first stage is turned on, the voltage at the node out1 drops to L level due to the low power supply potential at L level.

Note that since the second clock signal (CLK2) is at L level, the thin film transistor 356 in the pulse output circuit of the first stage is turned off.

Furthermore, as in the pulse output circuit of the first stage in the period T2, the thin film transistor 351 in the pulse output circuit of the second stage is turned off due to the second clock signal at L level. On the other hand, the first clock signal (CLK1) is at H level; thus, the thin film transistor 356 in the pulse output circuit of the second stage is turned on. Accordingly, the voltage at the node D is kept at H level due to the voltage at the node F which is at H level in the period T2.

Thus, each of the nodes in the pulse output circuit of the second stage is kept at the same level as in the period T2.

On the other hand, when the first clock signal (CLK1) retains H level, the thin film transistor 351 in the pulse output circuit of the third stage is turned on.

Then, the voltage at the node G rises to H level due to the voltage at the node out2 which is at H level.

When the voltage at the node G rises to H level, the thin film transistor 353 in the pulse output circuit of the third stage is turned on.

Subsequently, the transistors are controlled to be on or off in sequence, whereby the circuit illustrated in FIGS. 3A and 3B can operate as a shift register.

Note that in the pulse output circuit illustrated in FIGS. 3A and 3B, the thin film transistor 356 (the second switch 304) is provided between the node A and the node C. This structure is adopted in consideration of the voltage drop at the node C from the high power supply potential VDD due to the resistor 354. It is preferable that the node A and the node C be disconnected from each other to be independently driven by the thin film transistor 356 (the second switch 304), because the thin film transistor 353 can be driven more efficiently by the potential at the node A. Note that the circuit of this embodiment can be driven without the thin film transistor 356 (the second switch 304).

In addition, in the source line driver circuit, a NAND of a signal output from each pulse output circuit is calculated to generate a signal for driving each source line. Accordingly, in the source line driver circuit, a larger number of pulse output circuits than source lines are preferably provided to generate a signal output to a source line.

Figure 5A:
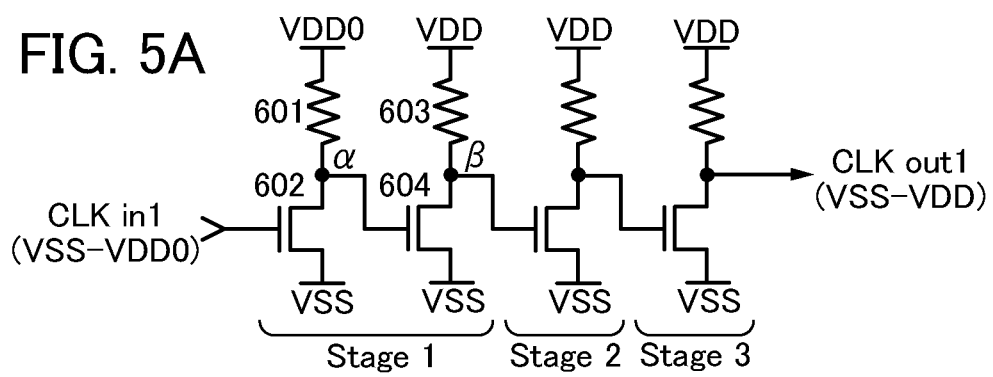
FIGS. 5A to 5C are circuit diagrams illustrating an example of a structure of a driver circuit.

FIG. 5A illustrates an example of a structure of the clock signal level shifter 201 illustrated in FIG. 2. Note that since the first clock signal (CLK1) level shifter and the second clock signal (CLK2) level shifter have the same structure, FIG. 5A illustrates only the first clock signal (CLK1) level shifter. FIG. 5A shows a structure in which the amplitude of the first clock signal (CLK1) is converted by an ERMOS circuit (Stage 1), and buffer stages (Stage 2 and Stage 3) are subsequently provided.

Operation of the circuit illustrated in FIG. 5A is described. It is assumed here that three potentials of VSS, VDD0, and VDD are used and VSS<VDD0<VDD is satisfied. By employing a structure in which the amplitude of the first clock signal (CLK1) is level-shifted in an input portion of a source line driver circuit, low power consumption and reduction in noise can be achieved.

A first input clock signal (CLK1) having an amplitude of L level/H level=VSS/VDD0 is input to a signal input portion (CLK in1).

When the first input clock signal is at H level, a thin film transistor 602 is turned on. Here, the on-resistance of the thin film transistor 602 is set much lower than the resistance of a resistor 601. Thus, a node α becomes L level.

When the node α is at L level, a thin film transistor 604 is turned off. Here, the off-resistance of the thin film transistor 604 is set much higher than the resistance of a resistor 603. Thus, a node β becomes H level, and the H level becomes substantially equal to VDD. As a result, amplitude conversion is completed.

In the level shifter illustrated in FIG. 5A, the buffer stages (Stage 2 and Stage 3) are provided after the level shifter circuit (Stage 1) in consideration of load of pulses after amplitude conversion. Operation is performed similarly in the Stage 2 and the Stage 3, whereby a pulse is finally output to a signal output portion.

FIG. 5A illustrates the first clock signal (CLK1) level shifter, and the start pulse (SP) level shifter has the same structure.

Figure 5B:
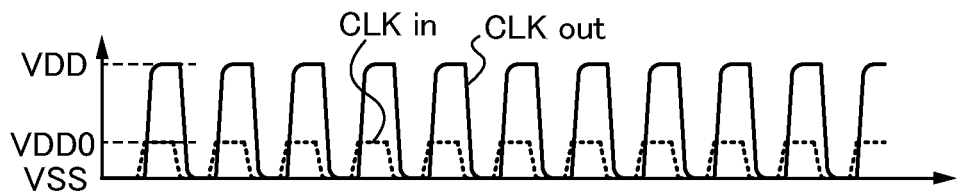

FIG. 5B shows the conversion of the amplitude of a clock signal. The amplitude of an input signal is L level/H level=VSS/VDD0, and the amplitude of an output signal is L level/H level=VSS/VDD.

Figure 5C:

FIG. 5C shows the conversion of the amplitude of a start pulse (SP). Like the clock signal, the amplitude of an input signal is L level/H level=VSS/VDD0, and the amplitude of an output signal is L level/H level=VSS/VDD.

Figure 6A:
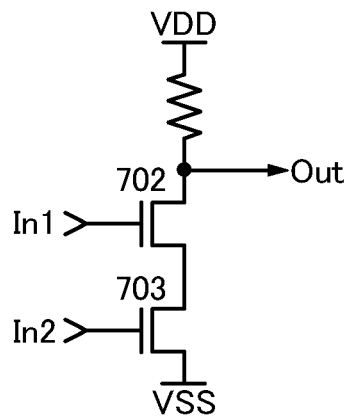
FIGS. 6A to 6C are circuit diagrams illustrating an example of a structure of a driver circuit.

FIG. 6A illustrates the NAND circuit 204 having two inputs illustrated in FIG. 2. The NAND circuit 204 has a structure similar to that of the ERMOS circuit. In specific, the NAND circuit is different from the ERMOS circuit only in that signals are input to two input portions and thin film transistors 702 and 703 are connected in series.

When an H-level signal is input to a signal input portion (In1) and a signal input portion (In2), the thin film transistors 702 and 703 are turned on, whereby an L-level signal is output to a signal output portion (Out).

On the other hand, when an L-level signal is input to one or both of the signal input portion (In1) and the signal input portion (In2), an H-level signal having a potential of VDD is output to the signal output portion (Out).

Figure 6B:
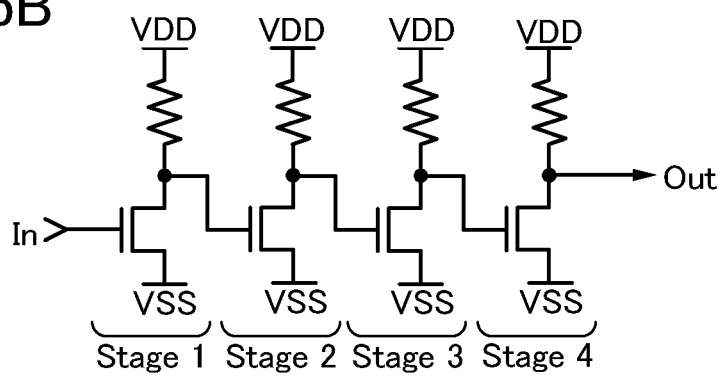

FIG. 6B illustrates the buffer 205 illustrated in FIG. 2. The buffer 205 includes ERMOS circuits (Stage 1 to Stage 4). The operation of the ERMOS circuits is described in the above description on the level shifter circuit, and thus the above description applies here.

Figure 6C:
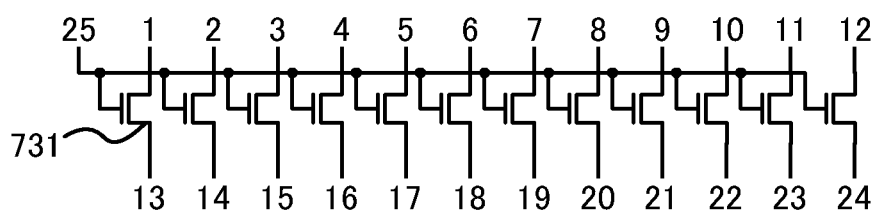

FIG. 6C illustrates the sampling switch 206 illustrated in FIG. 2. In the sampling switch 206, a sampling pulse is input to a signal input portion (25) so that 12 thin film transistors 731 connected in parallel are simultaneously controlled. An analog video signal is input to input electrodes (1) to (12) of the 12 thin film transistors 731, whereby the potential of a video signal at the time of input of the sampling pulse is written to a source signal line.

Figure 7:
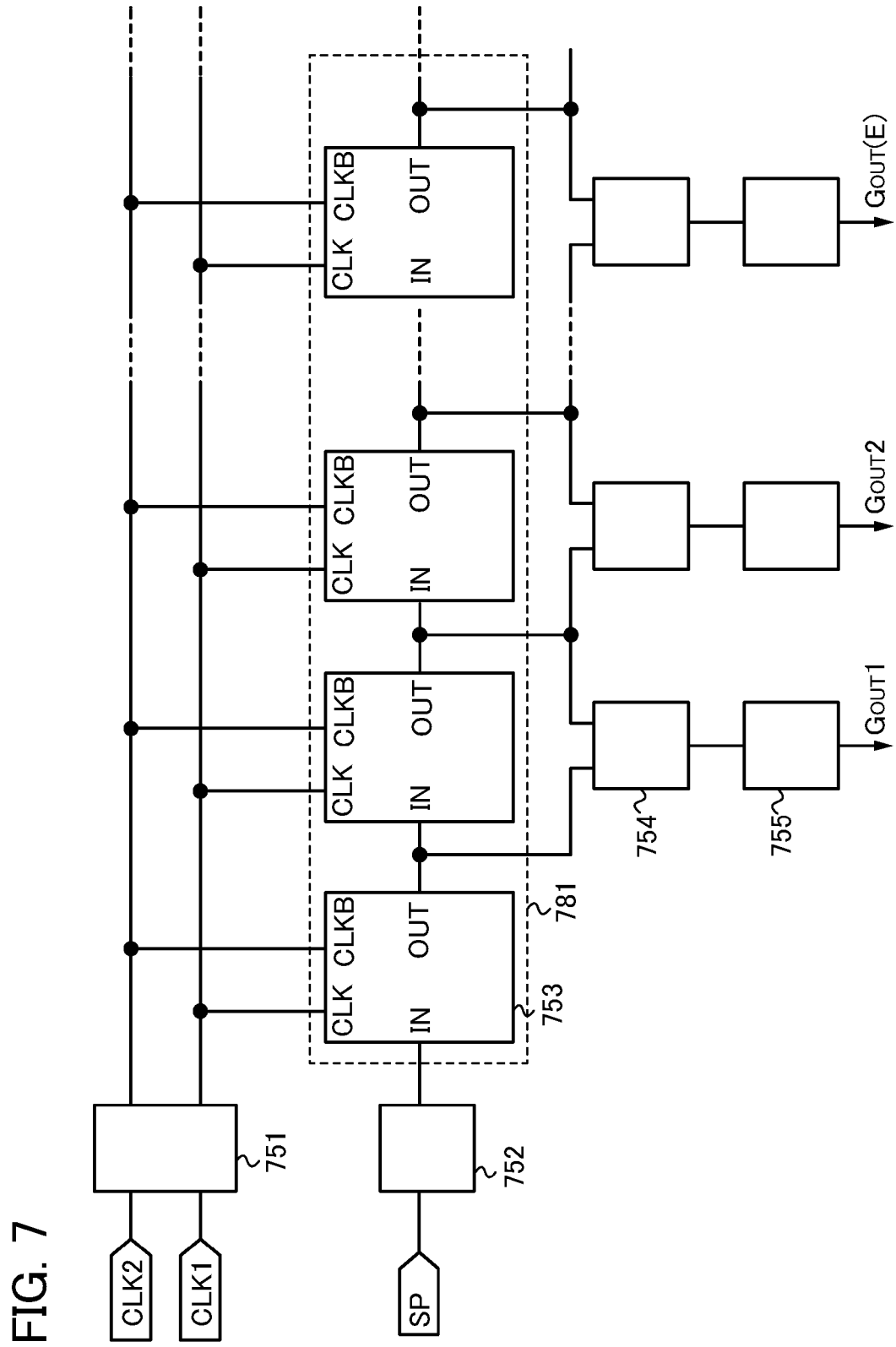
FIG. 7 is a block diagram illustrating an example of a structure of a driver circuit.

FIG. 7 illustrates a structure of the gate line driver circuit in the display device illustrated in FIG. 1. The gate line driver circuit includes a clock signal level shifter 751, a start pulse level shifter 752, a pulse output circuit 753 forming a shift register 781, a NAND circuit 754, and a buffer 755.

A first clock signal (CLK1), a second clock signal (CLK2), and a start pulse (SP) are input to the gate line driver circuit. The amplitude of these input signals is converted by the clock signal level shifter 751 or the start pulse level shifter 752 immediately after they have been input from the outside as signals with low voltage amplitude, and then the signals are input to the driver circuit as signals with high voltage amplitude.

Note that the structure and operation of the clock signal level shifter 751, the start pulse level shifter 752, the pulse output circuit 753, the NAND circuit 754, and the buffer 755 are similar to those used in the source line driver circuit, and thus the above description applies here.

Figure 8:
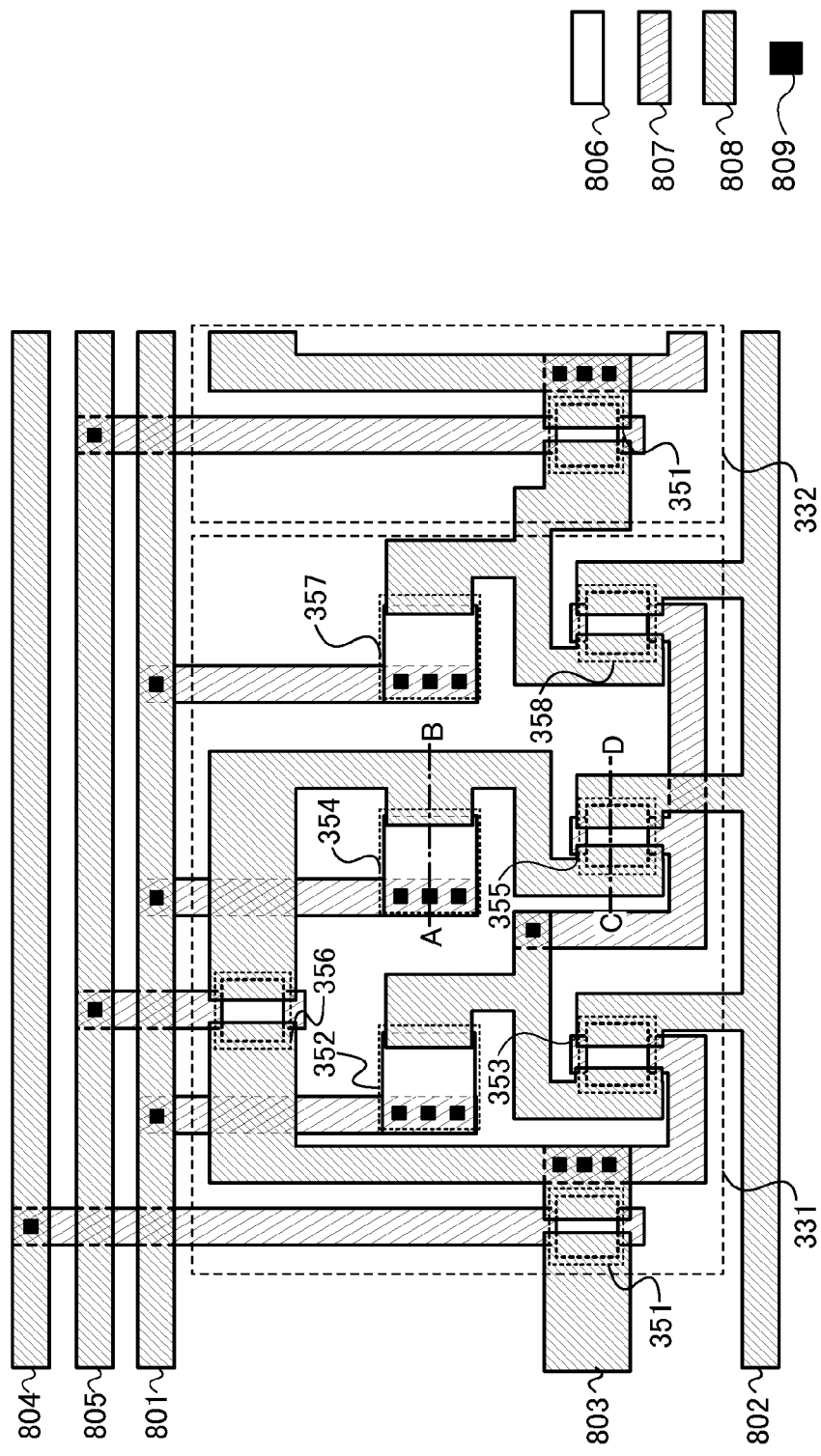
FIG. 8 is a layout illustrating an example of a structure of a driver circuit.
Figure 9:
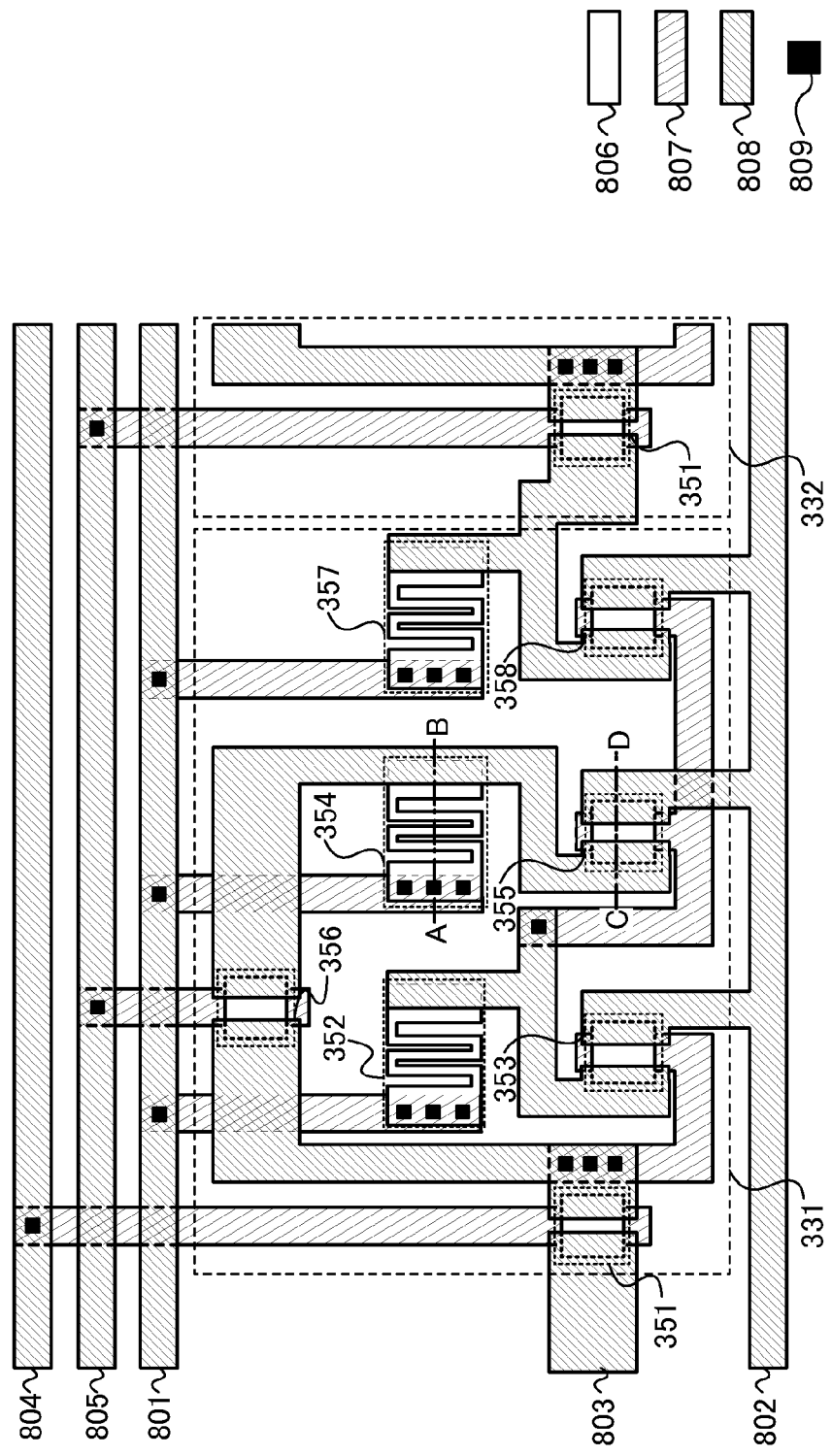
FIG. 9 is a layout illustrating an example of a structure of a driver circuit.
Figure 10:
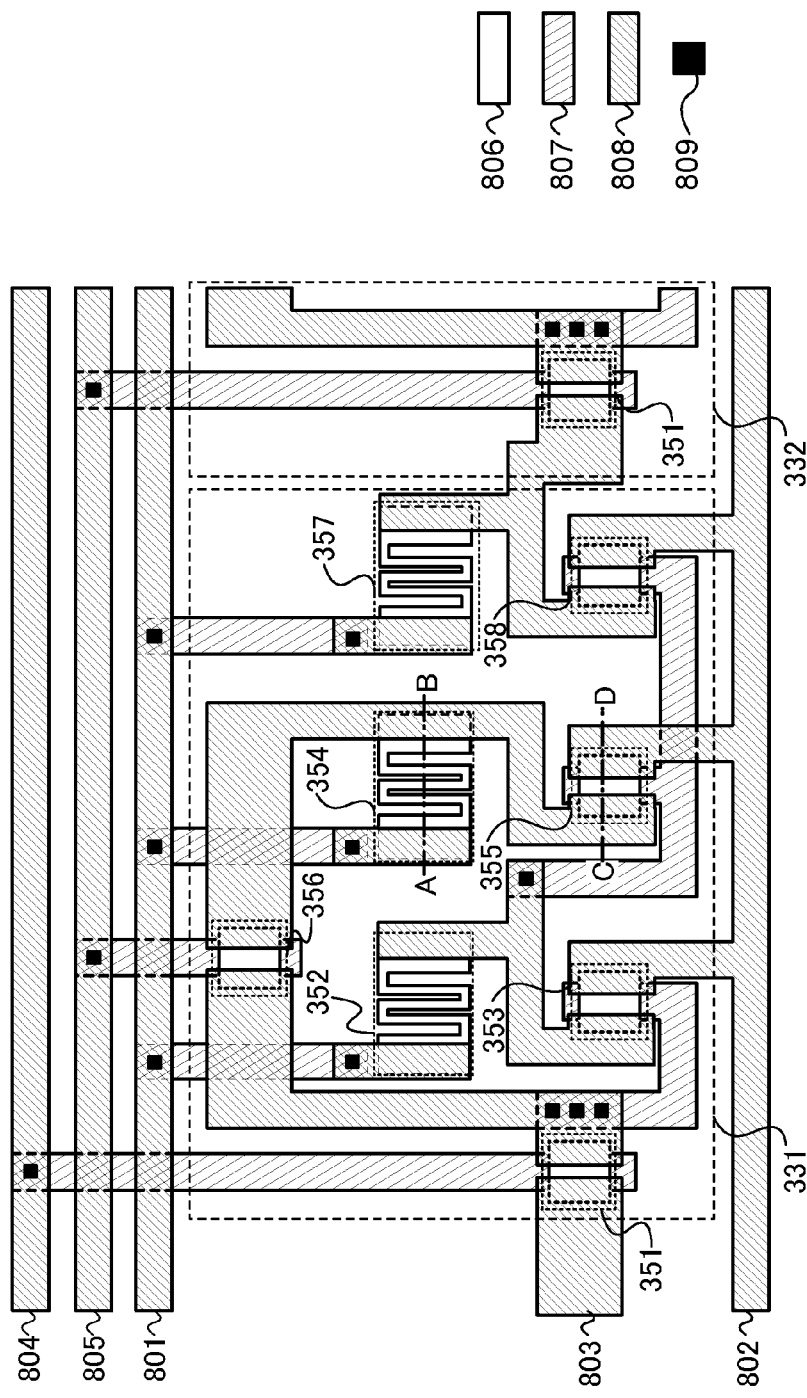
FIG. 10 is a layout illustrating an example of a structure of a driver circuit.

Next, FIG. 8 to FIG. 10 illustrate examples of a layout of the pulse output circuit illustrated in FIG. 3B. Note that FIG. 8 to FIG. 10 illustrate the pulse output circuit of the first stage among the multi-stage pulse output circuits.

The pulse output circuit illustrated in FIG. 8 to FIG. 10 includes a power supply line 801, a power supply line 802, a control signal line 803, a control signal line 804, a control signal line 805, thin film transistors 351, 353, 355, 356, and 358, and resistors 352, 354, and 357.

FIG. 8 to FIG. 10 illustrate an oxide semiconductor layer 806, a first wiring layer 807, a second wiring layer 808, and a contact hole 809. Note that the first wiring layer 807 is a layer including a gate terminal of a thin film transistor, and a second wiring layer 808 is a layer including a source terminal and a drain terminal (a first terminal and a second terminal) of a thin film transistor.

The connection relationship of each circuit element in FIG. 8 to FIG. 10 is similar to that in FIG. 3B. That is, the power supply line 801 is a wiring to which a high power supply potential VDD is supplied (also referred to as a high potential line), the power supply line 802 is a wiring to which a low power supply potential VSS is supplied (also referred to as a low potential line), the control signal line 803 is a wiring to which a start pulse (SP) is supplied, the control signal line 804 is a wiring to which a first clock signal is supplied, and the control signal line 805 is a wiring to which a second clock signal is supplied.

An oxide semiconductor layer with a rectangular shape is used for the resistors 352, 354, and 357 in the ERMOS circuit illustrated in FIG. 8. Therefore, the resistors 352, 354, and 357 illustrated in FIG. 8 have a wide current path and high current driving capability. An oxide semiconductor layer with a meander shape is used for the resistors 352, 354, and 357 in the ERMOS circuit illustrated in FIG. 9 and FIG. 10. The use of the oxide semiconductor layer with a meander shape can increase the resistance of the resistors 352, 354, and 357.

Note that in each layout of the pulse output circuits illustrated in FIG. 8 to FIG. 10, the thin film transistors 351, 353, 355, 356, and 358 may have a channel region with a U shape. Although the thin film transistors have the same size in FIG. 8, the size of the thin film transistors may be changed as appropriate depending on the amount of load of a subsequent stage.

Next, a structure of an inverter circuit including the resistor 354 and the thin film transistor 355 illustrated in the layouts of FIG. 8 to FIG. 10 will be described with reference to FIGS. 11A to 11C. Note that FIGS. 11A to 11C illustrate cross-sectional views of the resistor 354 and the thin film transistor 355, which are taken along a dotted line A-B and a dotted line C-D in FIG. 8 to FIG. 10.

Figure 11A:
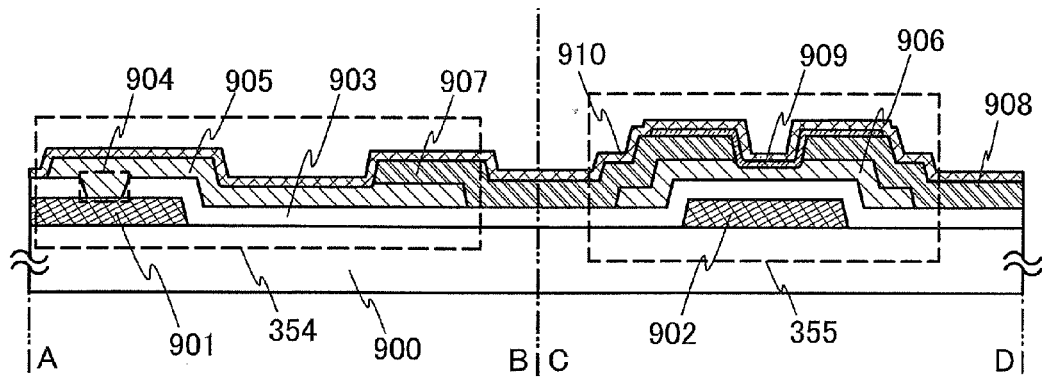
FIGS. 11A to 11C are diagrams illustrating an example of a structure of a driver circuit.
Figure 11B:
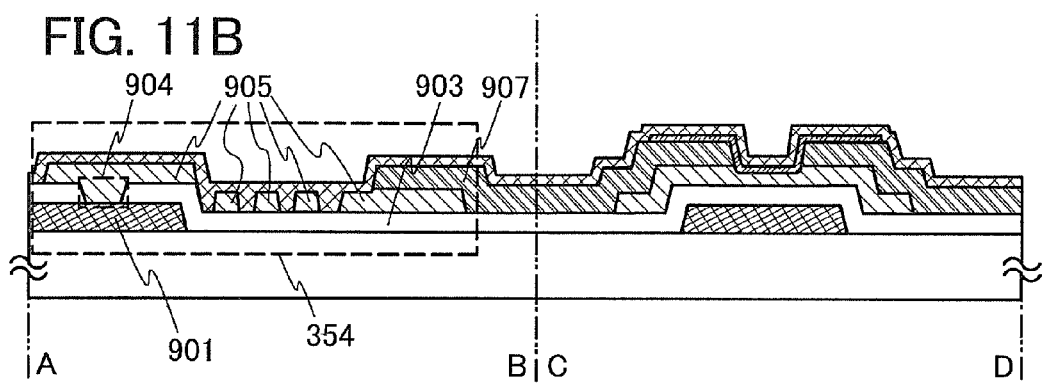
Figure 11C:
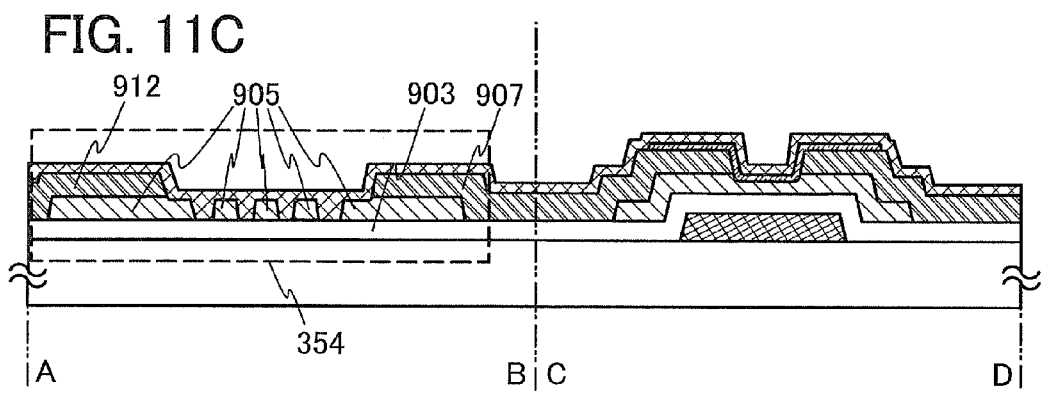

FIG. 11A is a cross-sectional view taken along the dotted lines A-B and C-D in FIG. 8. In FIG. 11A, a first oxide semiconductor layer 905 is used for a resistor element of the resistor 354. One terminal of the first oxide semiconductor layer 905 is connected to a first wiring 901 included in the first wiring layer 807 through a contact hole 904 provided in an insulating layer 903, and the other terminal of the first oxide semiconductor layer 905 is connected to a second wiring 907 included in the second wiring layer 808.

In FIG. 11A, the thin film transistor 355 includes a gate terminal 902 over a substrate, the insulating layer 903 over the gate terminal 902, which serves as a gate insulating layer, a second oxide semiconductor layer 906 over the insulating layer 903, which is to be a channel formation region, and the second wiring 907 and a third wiring 908 over the second oxide semiconductor layer 906, which serve as a source terminal and a drain terminal (a first terminal and a second terminal).

Note that the first wiring 901 serves as one terminal of the resistor 354. The second wiring 907 serves as the other terminal of the resistor 354 and one terminal of the thin film transistor 355, as well as a wiring for connecting the resistor 354 and the thin film transistor 355. Similarly, the third wiring 908 serves as the second terminal of the thin film transistor 355 as well as a wiring to which a low power supply potential VSS is supplied (also referred to as a low potential line). In other words, the connecting wiring and the low (high) power supply potential line are partly used as the first terminal or the second terminal of each thin film transistor.

In FIG. 11A, the thicknesses of the first oxide semiconductor layer 905 and the second oxide semiconductor layer 906 are not even. In specific, the first oxide semiconductor layer 905 and the second oxide semiconductor layer 906 in a region overlapping the second wiring 907 and the third wiring 908 have a thickness larger than that of the first oxide semiconductor layer 905 and the second oxide semiconductor layer 906 in the other region. This is because the first oxide semiconductor layer 905 and the second oxide semiconductor layer 906 are partly etched in etching for formation of the second wiring 907 and the third wiring 908.

FIG. 11B is a cross-sectional view taken along the dotted lines A-B and C-D in FIG. 9. In FIG. 11B, the first oxide semiconductor layer 905 formed in a meander shape is used for a resistor element of the resistor 354. One terminal of the first oxide semiconductor layer 905 is connected to the first wiring 901 through the contact hole 904 provided in the insulating layer 903, and the other terminal of the first oxide semiconductor layer 905 is connected to the second wiring 907. Since the structure of the thin film transistor is the same as that illustrated in FIG. 11A, the above description applies here.

FIG. 11C is a cross-sectional view taken along the dotted lines A-B and C-D in FIG. 10. In FIG. 11C, the first oxide semiconductor layer 905 formed in a meander shape is used for a resistor element of the resistor 354. One terminal of the first oxide semiconductor layer 905 is connected to a fourth wiring 912 included in the second wiring layer 808, and the other terminal of the first oxide semiconductor layer 905 is connected to the second wiring 907 included in the second wiring layer 808. Since the structure of the thin film transistor is the same as that illustrated in FIG. 11A, the above description applies here. In the resistor 354 illustrated in FIG. 11C, the fourth wiring 912 is formed on and in direct contact with the first oxide semiconductor layer 905; accordingly, a good contact can be made between the first oxide semiconductor layer and the fourth wiring.

Next, materials of the ERMOS circuit illustrated in FIGS. 11A to 11C will be specifically described.

In FIGS. 11A to 11C, a glass substrate such as a barium borosilicate glass substrate or an aluminoborosilicate glass substrate can be used as a substrate 900. The first wiring 901 and the gate terminal 902 can be made of a low-resistant conductive material such as aluminum (Al) or copper (Cu). Alternatively, the first wiring 901 and the gate terminal 902 may be formed of aluminum (Al) in combination with a heat-resistant conductive material. As the heat-resistant conductive material, it is possible to use an element selected from titanium (Ti), tantalum (Ta), tungsten (W), molybdenum (Mo), chromium (Cr), neodymium (Nd), and scandium (Sc), an alloy containing any of the elements, an alloy film combining the elements, or a nitride containing any of the elements.

The insulating layer 903 can be made of an insulating film such as a silicon oxide film, a silicon nitride film, a silicon oxynitride film, a silicon nitride oxide film, an aluminum oxide film, or a tantalum oxide film. The insulating layer 903 may have a multi-layer structure of these insulating films. Note that the silicon oxynitride film refers to a film which contains more oxygen than nitrogen and contains oxygen, nitrogen, silicon, and hydrogen at given concentrations ranging from 55 to 65 atomic %, 1 to 20 atomic %, 25 to 35 atomic %, and 0.1 to 10 atomic %, respectively, where the total percentage of atoms is 100 atomic %. Further, the silicon nitride oxide film refers to a film which contains more nitrogen than oxygen and contains oxygen, nitrogen, silicon, and hydrogen at given concentrations ranging from 15 to 30 atomic %, 20 to 35 atomic %, 25 to 35 atomic %, and 15 to 25 atomic %, respectively, where the total percentage of atoms is 100 atomic %.

The first oxide semiconductor layer 905 and the second oxide semiconductor layer 906 are made of a thin film containing a compound represented by $InMO_3(ZnO)_m$ (m>0). Note that M denotes one or more of metal elements selected from gallium (Ga), iron (Fe), nickel (Ni), manganese (Mn), and cobalt (Co). For example, M is gallium (Ga) in some cases, and in other cases, M contains other metal elements in addition to gallium (Ga), such as gallium (Ga) and nickel (Ni) or gallium (Ga) and iron (Fe). Furthermore, the above oxide semiconductor layer may contain a transition metal element such as iron (Fe) or nickel (Ni) or an oxide of the transition metal as an impurity element in addition to a metal element contained as M. In addition, the concentration of sodium (Na) contained in the above oxide semiconductor layer is $5 \times 10^{18}$ atoms/cm$^3$ or less, preferably $1 \times 10^{18}$ atoms/cm$^3$ or less.

As the material of the second wiring 907 and the third wiring 908, it is possible to use an element selected from aluminum (Al), chromium (Cr), tantalum (Ta), titanium (Ti), molybdenum (Mo), and tungsten (W), an alloy containing any of the elements, an alloy film combining the elements, or the like. The second wiring 907 and the third wiring 908 may have a multi-layer structure of these elements.

A silicon oxide layer 909 is made of a silicon oxide film deposited by sputtering. A silicon nitride layer 910 deposited over the entire surface of the substrate is formed by plasma CVD using a gas containing a hydrogen compound such as silane ($SiH_4$) and ammonia ($NH_3$). Accordingly, the silicon nitride layer 910 contains a high concentration of hydrogen.

Figure 12A:
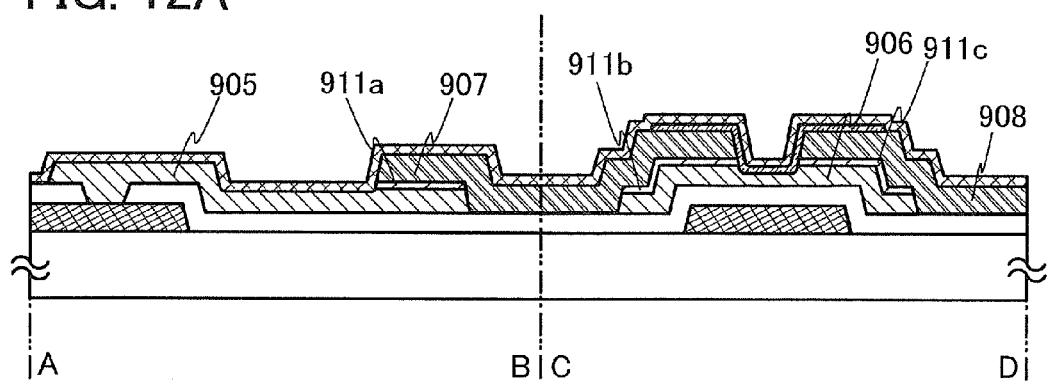
FIGS. 12A and 12B are diagrams illustrating an example of a structure of a driver circuit.

In addition, as illustrated in FIG. 12A, buffer layers 911a to 911c may be provided between the first oxide semiconductor layer 905 and the second oxide semiconductor layer 906, and the second wiring 907 and the third wiring 908.

Note that the buffer layers 911a to 911c are oxide semiconductor layers having a low resistance, which are formed using an In—Ga—Zn—O-based non-single-crystal film deposited under conditions different from those under which the first oxide semiconductor layer 905 and the second oxide semiconductor layer 906 are formed. In the description below, for convenience, an oxide semiconductor film for forming the first oxide semiconductor layer 905 and the second oxide semiconductor layer 906 is referred to as a first oxide semiconductor film, and an oxide semiconductor film for forming the buffer layers 911a to 911c is referred to as a second oxide semiconductor film.

For example, in the case where an oxide semiconductor film is deposited by sputtering, the resistance of the oxide semiconductor film can be changed by changing the oxygen concentration in a sputtering gas used for the deposition. In specific, the resistance of the oxide semiconductor film can be increased by increasing the oxygen concentration in a sputtering gas. One of the conditions for depositing the first oxide semiconductor film and the second oxide semiconductor film by sputtering is as follows: a sputtering gas containing an argon gas at a flow rate of 10 sccm and an oxygen gas at a flow rate of 5 sccm is used for depositing the first oxide semiconductor film; and a sputtering gas containing an argon gas at a flow rate of 40 sccm is used for depositing the second oxide semiconductor film. Note that the buffer layers 911a to 911c have n-type conductivity and an activation energy ($\Delta E$) of 0.1 eV or less. The buffer layers 911a to 911c formed using an In—Ga—Zn—O-based non-single-crystal film include at least an amorphous component. The buffer layers 911a to 911c include a crystal grain (nanocrystal) in the amorphous structure in some cases. The crystal grain (nanocrystal) in the buffer layers 911a to 911c has a diameter of 1 nm to 10 nm, and typically about 2 nm to 4 nm.

By providing the buffer layers 911a to 911c having a lower resistance than the first oxide semiconductor layer 905 and the second oxide semiconductor layer 906, a better contact than a Schottky junction can be made between the second wiring 907 that is a conductor and the first oxide semiconductor layer 905, and between the second wiring 907 and the third wiring 908 that are conductors, and the second oxide semiconductor layer 906. As a result, thermally stable operation can be achieved. Furthermore, by providing the buffer layers 911b and 911c in the thin film transistor 355, good mobility can be maintained even at a high drain voltage.

Figure 12B:
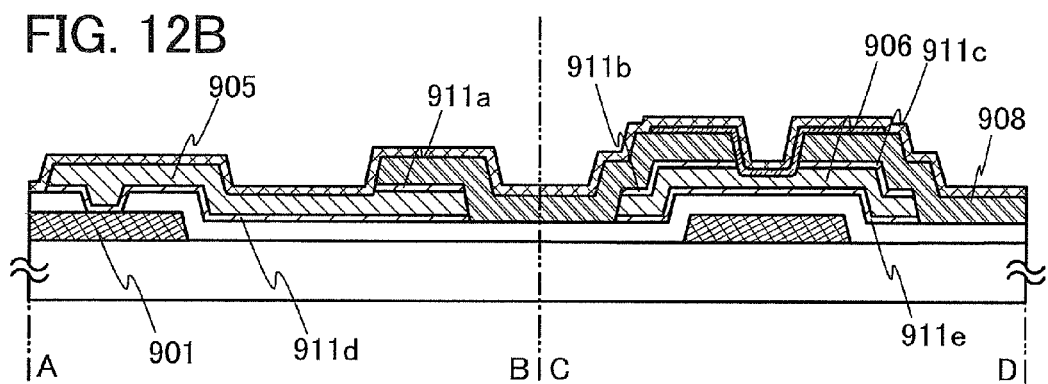

In addition, as illustrated in FIG. 12B, the buffer layers 911a to 911c and buffer layers 911d and 911e may be provided above and below the first oxide semiconductor layer 905 and the second oxide semiconductor layer 906.

By providing the buffer layer 911d, a better contact than a Schottky junction can be made between the first wiring 901 that is a conductor and the first oxide semiconductor layer 905, and thermally stable operation can be achieved.

Figure 13A:
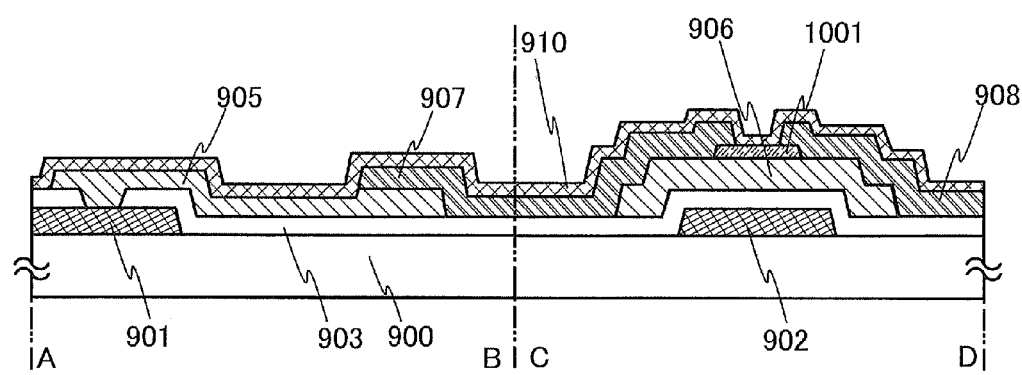
FIGS. 13A and 13B are diagrams illustrating an example of a structure of a driver circuit.
Figure 13B:
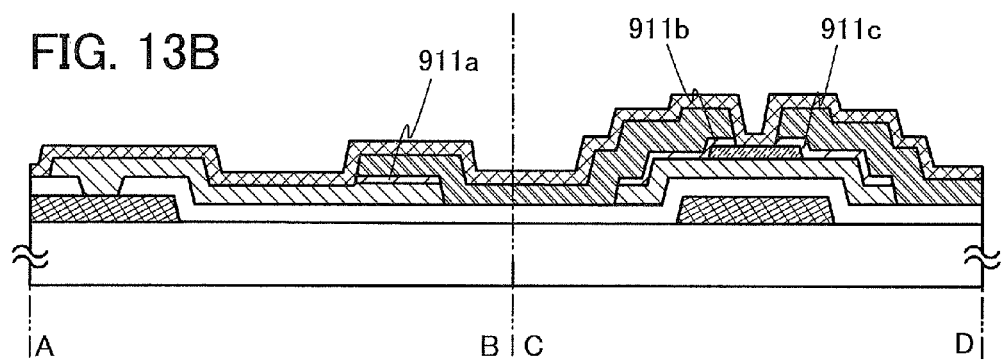

Next, thin film transistors having a structure different from those illustrated in FIGS. 11A to 11C and FIGS. 12A and 12B will be described with reference to FIGS. 13A and 13B. Note that FIGS. 13A and 13B illustrate cross-sectional structures of the resistor and the thin film transistor, which are taken along the dotted line A-B and the dotted line C-D in FIG. 8. In FIGS. 13A and 13B, the same components as in FIGS. 11A to 11C are denoted by the same reference numerals.

In FIG. 13A, a channel protective layer 1001 that is a silicon oxide layer is provided over the second oxide semiconductor layer 906, and the second wiring 907 and the third wiring 908 are provided over the channel protective layer 1001 and the second oxide semiconductor layer 906. Furthermore, the silicon nitride layer 910 is provided over the second wiring 907, the third wiring 908, and the channel protective layer 1001. In addition, the buffer layers 911a to 911c may be provided between the first oxide semiconductor layer 905 and the second oxide semiconductor layer 906, and the second wiring 907 and the third wiring 908 as illustrated in FIG. 13B.

Figure 14A:
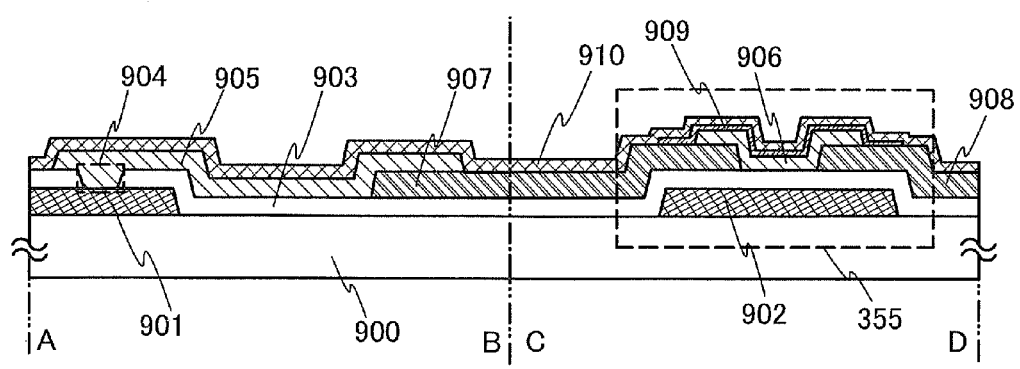
FIGS. 14A and 14B are diagrams illustrating an example of a structure of a driver circuit.
Figure 14B:
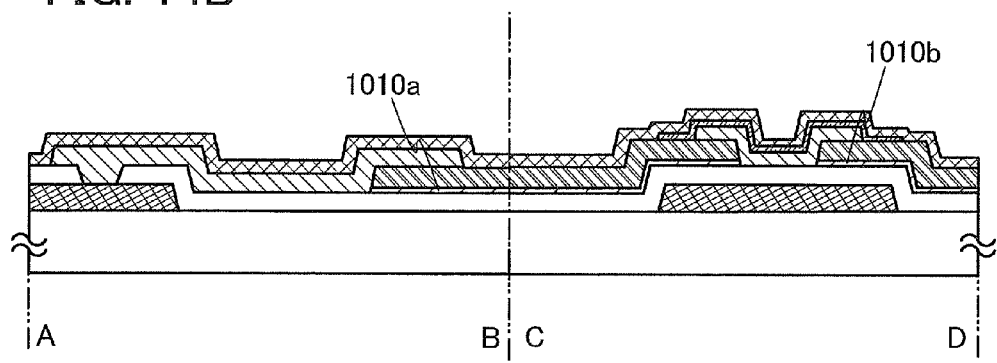

Although an inverted staggered thin film transistor is shown in FIGS. 11A to 11C, FIGS. 12A and 12B, and FIGS. 13A and 13B, the thin film transistor of this embodiment is not limited to the inverted staggered thin film transistor. For example, the same effect can be obtained by using a coplanar thin film transistor. Examples of a cross-sectional structure of the coplanar thin film transistor are illustrated in FIGS. 14A and 14B and described. Note that FIGS. 14A and 14B illustrate cross-sectional structures of the resistor and the thin film transistor, which are taken along the dotted line A-B and the dotted line C-D in FIG. 8. In FIGS. 14A and 14B, the same components as in FIGS. 11A to 11C are denoted by the same reference numerals.

In FIG. 14A, one end of the first oxide semiconductor layer 905 is provided over the first wiring 901, the other end of the first oxide semiconductor layer 905 and one end of the second oxide semiconductor layer 906 are provided over the second wiring 907, and the other end of the second oxide semiconductor layer 906 is provided over the third wiring 908. Furthermore, the silicon oxide layer 909 and the silicon nitride layer 910 are stacked over the second oxide semiconductor layer 906, and only the silicon nitride layer 910 is provided over the first oxide semiconductor layer 905. In addition, as illustrated in FIG. 14B, buffer layers 1010a and 1010b may be provided between the second wiring 907 and the third wiring 908, and the insulating layer 903.

In FIGS. 11A to 11C, FIGS. 12A and 12B, FIGS. 13A and 13B, and FIGS. 14A and 14B, the silicon nitride layer 910 is formed in direct contact with the first oxide semiconductor layer 905 by plasma CVD using a gas containing a hydrogen compound such as silane ($SiH_4$) and ammonia ($NH_3$).

An ERMOS circuit having the aforementioned structure includes a resistor in which the first oxide semiconductor layer 905 on which the silicon nitride layer 910 is provided in direct contact therewith is used for a resistor element, and a thin film transistor in which the second oxide semiconductor layer 906 over which the silicon nitride layer 910 is provided with the silicon oxide layer 909 (the channel protective layer 1001) interposed therebetween is used for a channel formation region. Accordingly, a higher concentration of hydrogen can be introduced into the first oxide semiconductor layer 905 than into the second oxide semiconductor layer 906. As a result, the resistance of the first oxide semiconductor layer 905 can be made lower than that of the second oxide semiconductor layer 906.

Next, a manufacturing process of the ERMOS circuit will be described with reference to cross-sectional views of FIGS. 15A to 15C. Note that a manufacturing process of the ERMOS circuit illustrated in FIG. 14B will be described here.

A first conductive film is deposited over the substrate 900. The first conductive film is deposited by a thin film deposition method typified by sputtering, vacuum evaporation, pulse laser deposition, ion plating, and the like. As the material of the first conductive film, a low-resistance conductive material such as aluminum (Al) or copper (Cu) can be used. Alternatively, the first conductive film may be formed of aluminum (Al) in combination with a heat-resistant conductive material. As the heat-resistant conductive material, it is possible to use an element selected from titanium (Ti), tantalum (Ta), tungsten (W), molybdenum (Mo), chromium (Cr), neodymium (Nd), and scandium (Sc), an alloy containing any of the elements, an alloy film combining the elements, or a nitride containing any of the elements. Then, a resist is formed over the first conductive film by a first photolithography step. Furthermore, the first conductive film is selectively etched using the resist as a mask, thereby forming the first wiring 901 and the gate terminal 902.

Then, an insulating film is formed to cover the first wiring 901 and the gate terminal 902. The insulating film is deposited by a thin film deposition method typified by sputtering, vacuum evaporation, pulse laser deposition, ion plating, plasma CVD, and the like. The insulating film can be made of an insulating film such as a silicon oxide film, a silicon nitride film, a silicon oxynitride film, a silicon nitride oxide film, an aluminum oxide film, or a tantalum oxide film. The insulating film may have a multi-layer structure of these insulating films. Then, a resist is formed over the insulating film by a second photolithography step. Furthermore, the insulating film is selectively etched using the resist as a mask, thereby forming the insulating layer 903 having the contact hole 904 that reaches the first wiring. FIG. 15A is a cross-sectional view in which these steps have been completed.

Then, a second oxide semiconductor film is deposited. The second oxide semiconductor film is deposited by a thin film deposition method typified by sputtering, vacuum evaporation, pulse laser deposition, ion plating, plasma CVD, and the like. In the case where the second oxide semiconductor film is deposited by sputtering, it is preferable to use a target made by sintering $In_2O_3$, $Ga_2O_3$, and ZnO. As a sputtering gas, a rare gas typified by an argon gas is used. One of the deposition conditions by sputtering is as follows: a target made by mixing and sintering $In_2O_3$, $Ga_2O_3$, and ZnO (1:1:1) is used; pressure is 0.4 Pa; direct current (DC) power source is 500 W; and the flow rate of argon gas is 40 sccm.

Then, a second conductive film is deposited. The second conductive film is deposited by a thin film deposition method typified by sputtering, vacuum evaporation, pulse laser deposition, ion plating, and the like. As the material of the second conductive film, it is possible to use an element selected from aluminum (Al), chromium (Cr), tantalum (Ta), titanium (Ti), molybdenum (Mo), and tungsten (W), an alloy containing any of the elements, an alloy film combining the elements, or the like. The second conductive film may have a multi-layer structure of these elements.

Then, a resist is formed over the second conductive film by a third photolithography step. Furthermore, the second oxide semiconductor film and the second conductive film are selectively etched using the resist as a mask, thereby forming the second wiring 907, the third wiring 908, and the buffer layers 1010a and 1010b. This etching step is performed by wet etching or dry etching. For example, in the case where an aluminum (Al) film or an aluminum alloy film is used as the second conductive film, wet etching can be performed using a mixed solution of phosphoric acid, acetic acid, and nitric acid. Similarly, in the case where a titanium (Ti) film or a titanium alloy film is used as the second conductive film, wet etching can be performed using an ammonia hydrogen peroxide mixture (hydrogen peroxide:ammonia:water=5:2:2).

Then, a first oxide semiconductor film is deposited. The first oxide semiconductor film is deposited by a thin film deposition method typified by sputtering, vacuum evaporation, pulse laser deposition, ion plating, and the like. The first oxide semiconductor film is deposited under the conditions in which a sputtering gas contains a higher oxygen concentration than under the conditions for forming the second oxide semiconductor film. One of the deposition conditions by sputtering is as follows: a target made by mixing and sintering $In_2O_3$, $Ga_2O_3$, and ZnO (1:1:1) is used; pressure is 0.4 Pa; direct current (DC) power source is 500 W; the flow rate of argon gas is 10 sccm; and the flow rate of oxygen gas is 5 sccm.

Before depositing the first oxide semiconductor film, reverse sputtering where an argon gas is introduced to generate plasma is preferably performed, so that dust attached to the insulating layer 903, the first wiring 901, the second wiring 907, and the third wiring 908 can be removed. In addition, the reverse sputtering is preferably conducted in an atmosphere in which oxygen is added to argon, whereby the first wiring 901, the second wiring 907, and the third wiring 908 that are conductors are oxidized, resulting in an increase in the resistance in the vicinity of the interface with the second oxide semiconductor film. Thus, the off-current of a thin film transistor formed later can be reduced. Note that the reverse sputtering is a method in which voltage is applied to a substrate side in an argon atmosphere with the use of an RF power source without applying voltage to a target side, so that plasma is generated to modify the surface of the substrate.

Then, a resist is formed over the first oxide semiconductor film by a fourth photolithography step. Furthermore, the first oxide semiconductor film is selectively etched using the resist as a mask, thereby forming the first oxide semiconductor layer 905 and the second oxide semiconductor layer 906. FIG. 15B is a cross-sectional view in which these steps have been completed.

Then, a silicon oxide film is deposited by sputtering. For example, the silicon oxide film can be deposited using silicon as a target and using a sputtering gas containing argon and oxygen. Alternatively, the silicon oxide film can be deposited using silicon oxide as a target and using argon as a sputtering gas. Subsequently, a resist is formed over the silicon oxide film by a fifth photolithography step. Furthermore, the silicon oxide film is selectively etched using the resist as a mask, thereby forming the silicon oxide layer 909 over the second oxide semiconductor layer 906.

Then, the silicon nitride layer 910 serving as a passivation film is deposited over the entire surface of the substrate. The silicon nitride layer 910 is formed by plasma CVD using a gas containing a hydrogen compound such as silane ($SiH_4$) and ammonia ($NH_3$), and is a silicon nitride layer containing a high concentration of hydrogen.

Then, heat treatment is performed at 200° C. to 600° C., typically 250° C. to 500° C. For example, heat treatment is performed in a furnace in a nitrogen atmosphere at 350° C. for one hour. FIG. 15C is a cross-sectional view in which these steps have been completed.

Through the above steps, the resistor 354 and the thin film transistor 355 can be manufactured using the oxide semiconductor layers.

Note that the order of the steps described above is an example and there is no particular limitation on the order.

Figure 15A:
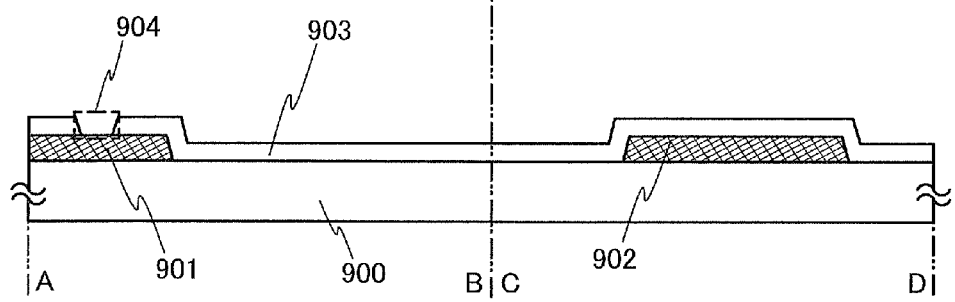
FIGS. 15A to 15C are diagrams illustrating an example of a manufacturing process of a driver circuit.
Figure 15B:
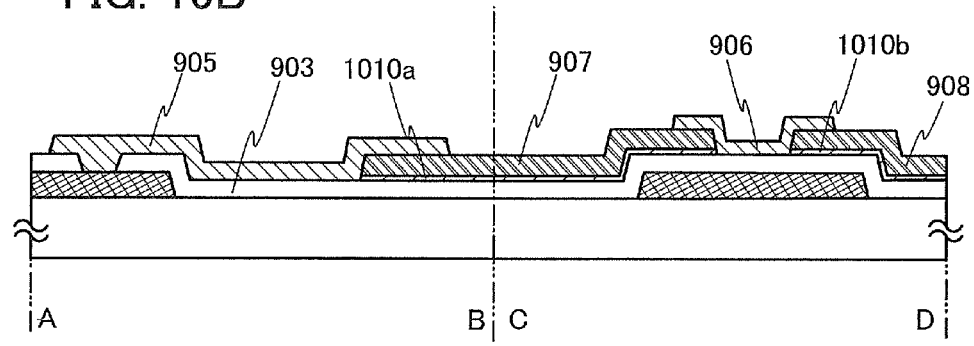
Figure 15C:
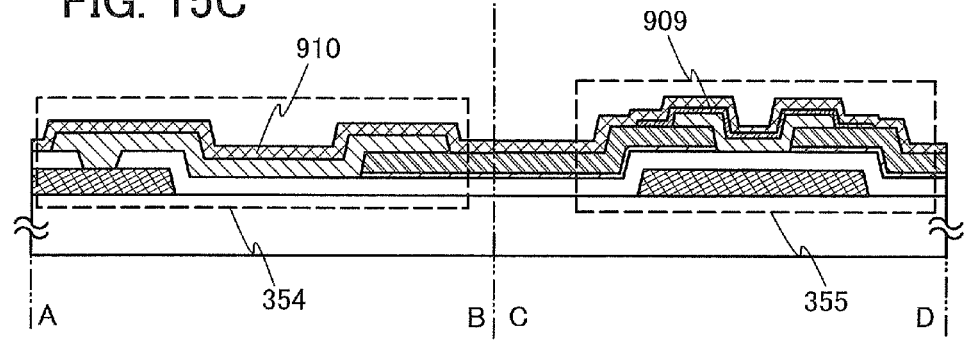
Figure 16A:
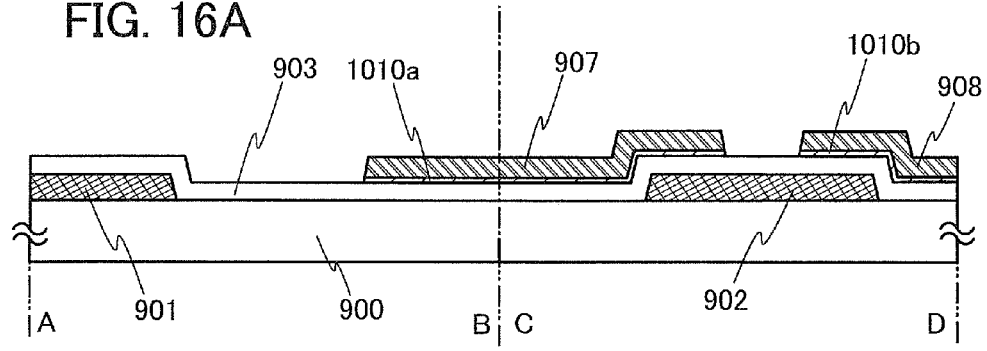
FIGS. 16A to 16C are diagrams illustrating an example of a manufacturing process of a driver circuit.
Figure 16B:
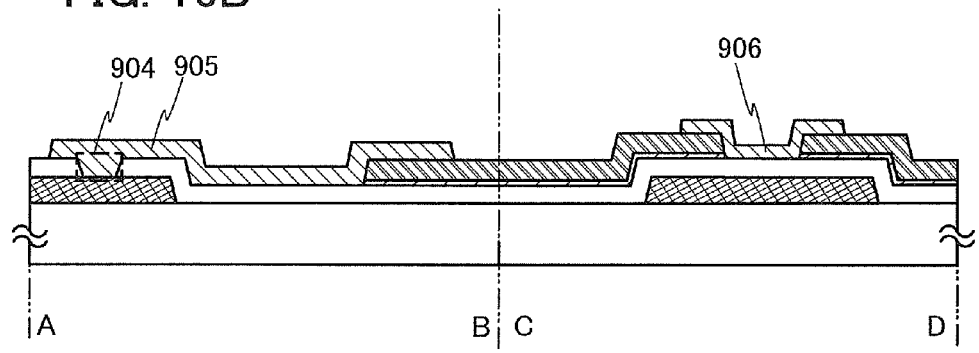
Figure 16C:
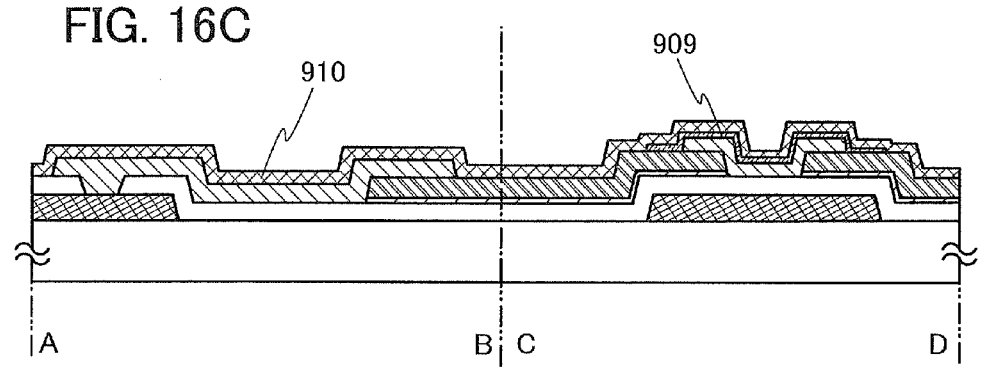

Manufacturing steps different from those in FIGS. 15A to 15C are illustrated in FIGS. 16A to 16C and described.

A first conductive film is deposited over the substrate 900. Then, a resist is formed over the first conductive film by a first photolithography step. Furthermore, the first conductive film is selectively etched using the resist as a mask, thereby forming the first wiring 901 and the gate terminal 902.

Then, an insulating film is formed to cover the first wiring 901 and the gate terminal 902. After that, a second oxide semiconductor film is deposited. Then, a second conductive film is deposited. Subsequently, a resist is formed over the second conductive film by a second photolithography step. Furthermore, the second conductive film and the second oxide semiconductor film are selectively etched using the resist as a mask, thereby forming the second wiring 907, the third wiring 908, and the buffer layers 1010*a* and 1010*b*. FIG. 16A is a cross-sectional view in which these steps have been completed.

Then, a resist is formed over the insulating film by a third photolithography step. Furthermore, the insulating film is selectively etched using the resist as a mask, thereby forming the insulating layer 903 having the contact hole 904 that reaches the first wiring 901.

Then, a first oxide semiconductor film is deposited. After that, a resist is formed over the first oxide semiconductor film by a fourth photolithography step. Furthermore, the first oxide semiconductor film is selectively etched using the resist as a mask, thereby forming the first oxide semiconductor layer 905 and the second oxide semiconductor layer 906. FIG. 16B is a cross-sectional view in which these steps have been completed.

Then, a silicon oxide film is deposited by sputtering. Subsequently, a resist is formed over the silicon oxide film by a fifth photolithography step. Furthermore, the silicon oxide film is selectively etched using the resist as a mask, thereby forming the silicon oxide layer 909 to cover the second oxide semiconductor layer 906.

Then, the silicon nitride layer 910 serving as a passivation film is deposited over the entire surface of the substrate by plasma CVD using a gas containing a hydrogen compound such as silane ($SiH_4$) and ammonia ($NH_3$).

Then, heat treatment is performed at 200° C. to 600° C. in a nitrogen atmosphere. FIG. 16C is a cross-sectional view in which these steps have been completed.

Through the above steps, the resistor 354 and the thin film transistor 355 can be manufactured using the oxide semiconductor layers. In addition, in the steps illustrated in FIGS. 16A to 16C, the first oxide semiconductor film can be deposited after the contact hole 904 is formed. Therefore, the number of steps in which the bottom surface of the contact hole is exposed can be reduced, and the material of the first wiring 901 can be selected more freely.

The resistor and the thin film transistor described in this embodiment are formed using the oxide semiconductor layers. Accordingly, a driver circuit including the resistor and the thin film transistor has good dynamic characteristics. Moreover, the silicon nitride layer formed by plasma CVD using a gas containing a hydrogen compound such as silane ($SiH_4$) and ammonia ($NH_3$) is provided on and in direct contact with the first oxide semiconductor layer used for the resistor, and the silicon nitride layer is provided over the second oxide semiconductor layer used for the thin film transistor with the silicon oxide layer serving as a barrier layer interposed therebetween. Therefore, a higher concentration of hydrogen is introduced into the first oxide semiconductor layer in direct contact with the silicon nitride layer containing a high concentration of hydrogen than into the second oxide semiconductor layer. As a result, the resistance of the first oxide semiconductor layer can be made lower than that of the second oxide semiconductor layer. Thus, the thin film transistor and the resistor do not need to be manufactured in different steps, which makes it possible to provide a driver circuit manufactured in a smaller number of steps.

Embodiment 2

Figure 17:
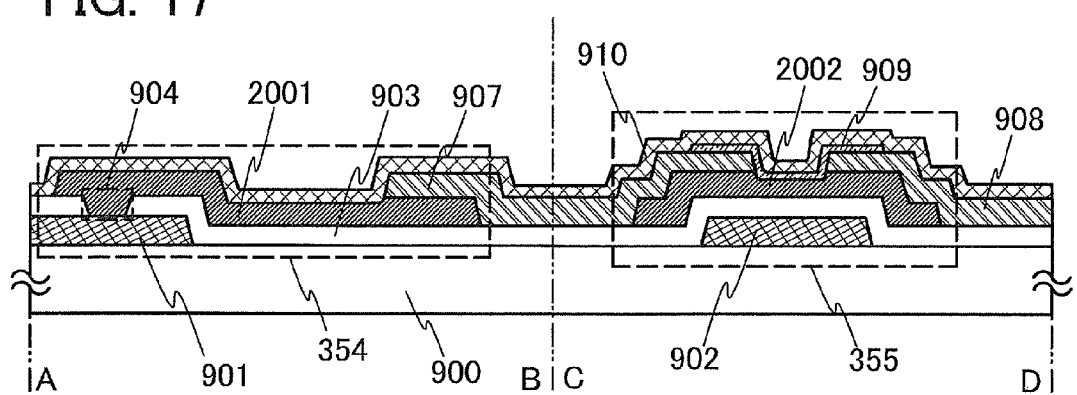
FIG. 17 is a diagram illustrating an example of a structure of a driver circuit.

In this embodiment, another example of the resistor and the thin film transistor, which is different from that of Embodiment 1, will be described with reference to FIG. 17. Note that FIG. 17 illustrates a cross-sectional structure of the resistor and the thin film transistor, which is taken along the dotted line A-B and the dotted line C-D in FIG. 8 shown in Embodiment 1.

The first wiring 901 and the gate terminal 902 are provided over the substrate 900. Then, the insulating layer 903 is provided over the first wiring 901 and the gate terminal 902. Note that the substrate 900, the first wiring 901, the gate terminal 902, and the insulating layer 903 can be made of the materials described in Embodiment 1; thus, the description of Embodiment 1 applies in this embodiment.

A first oxide semiconductor layer 2001 containing a high concentration of nitrogen and a second oxide semiconductor layer 2002 containing a high concentration of nitrogen are provided over the insulating layer 903 so as to overlap the first wiring 901 and the gate terminal 902, respectively. Note that the first wiring 901 is in contact with the first oxide semiconductor layer 2001 containing a high concentration of nitrogen through the contact hole 904 formed in the insulating layer 903.

Note that the first oxide semiconductor layer 2001 containing a high concentration of nitrogen and the second oxide semiconductor layer 2002 containing a high concentration of nitrogen are oxide semiconductor layers with a high concentration of nitrogen, which are formed of an oxide semiconductor film formed under conditions different from those under which the first oxide semiconductor film and the second oxide semiconductor film shown in Embodiment 1 are formed. In specific, the first oxide semiconductor layer 2001 and the second oxide semiconductor layer 2002 each have a ratio of nitrogen (N) to oxygen (O) (N/O) of 0.05 to 0.8, preferably 0.1 to 0.5.

For example, in the case where the oxide semiconductor film containing a high concentration of nitrogen is deposited by sputtering, deposition may be performed using a sputtering gas containing a nitrogen gas. One of the deposition conditions by sputtering is as follows: a target including $In_2O_3$, $Ga_2O_3$, and ZnO (1:1:1) (In:Ga:Zn=1:1:0.5) is used; pressure is 0.4 Pa; direct current (DC) power source is 500 W; the flow rate of argon gas is 35 sccm and the flow rate of nitrogen gas is 5 sccm. Note that it is preferable to use a pulsed direct current (DC) power source so that dust can be reduced and thickness distribution can be evened. Subsequently, the oxide semiconductor film containing a high concentration of nitrogen is subjected to photolithography, thereby forming the first oxide semiconductor layer 2001 containing a high concentration of nitrogen and the second oxide semiconductor layer 2002 containing a high concentration of nitrogen.

Then, the second wiring 907 and the third wiring 908 are provided. The second wiring 907 covers one end of the first oxide semiconductor layer 2001 containing a high concentration of nitrogen and one end of the second oxide semiconductor layer 2002 containing a high concentration of nitrogen, and the third wiring 908 covers the other end of the second oxide semiconductor layer 2002 containing a high concentration of nitrogen. Note that the second wiring 907 and the third wiring 908 can be made of the materials described in Embodiment 1; thus, the description of Embodiment 1 applies in this embodiment.

Then, the silicon oxide layer 909 is provided over the second oxide semiconductor layer 2002 containing a high concentration of nitrogen. The silicon oxide layer is formed by selectively etching a silicon oxide film which is deposited by sputtering. The silicon oxide film can be deposited using silicon as a target and using a sputtering gas containing argon and oxygen, or deposited using silicon oxide as a target and using a sputtering gas containing argon.

At this time, heat treatment is performed at 200° C. to 600° C., typically 250° C. to 500° C. in an atmosphere containing a substance which is a supply source of a hydrogen atom. For example, the heat treatment is performed at 350° C. for one hour. As the atmosphere containing a substance which is a supply source of a hydrogen atom, a mixed atmosphere of hydrogen and a rare gas such as argon can be used.

Nitrogen in the oxide semiconductor layer has the effect of preventing atoms forming the oxide semiconductor layer from tightly filling the film, and of promoting diffusion and solid dissolution of hydrogen in the film. Accordingly, the heat treatment allows hydrogen to be introduced into the first oxide semiconductor layer 2001 containing a high concentration of nitrogen. As a result, the concentration of hydrogen in the first oxide semiconductor layer 2001 containing a high concentration of nitrogen becomes higher than that in the second oxide semiconductor layer 2002 containing a high concentration of nitrogen. In other words, the resistance of the first oxide semiconductor layer 2001 containing a high concentration of nitrogen can be made lower than that of the second oxide semiconductor layer 2002 containing a high concentration of nitrogen.

Furthermore, the silicon nitride layer 910 is formed over the entire surface of the substrate by plasma CVD using a gas containing a hydrogen compound such as silane ($SiH_4$) and ammonia ($NH_3$). The silicon nitride layer 910 is a silicon nitride layer containing a high concentration of hydrogen. Accordingly, the concentration of hydrogen in the first oxide semiconductor layer 2001 containing a high concentration of nitrogen that is in direct contact with the silicon nitride layer 910 can be further increased to reduce resistance.

Through the above steps, it is possible to form the resistor 354 using the first oxide semiconductor layer 2001 containing a high concentration of nitrogen and having a low resistance and the thin film transistor 355 using the second oxide semiconductor layer 2002 containing a high concentration of nitrogen and having a high resistance.

Although the cross-sectional structure of the resistor corresponding to the line A-B in FIG. 8 is shown in this embodiment, the first oxide semiconductor layer containing a high concentration of nitrogen may have a meander shape as illustrated in FIG. 9 and FIG. 10. In addition, as illustrated in FIG. 10, the wiring layers may be formed over the both ends of the oxide semiconductor layer containing a high concentration of nitrogen.

In this embodiment, the cross-sectional structure of the channel-etched thin film transistor is shown; however, a channel-stop thin film transistor can also be used. Furthermore, although the inverted staggered thin film transistor is shown in this embodiment, a coplanar thin film transistor can also be used.

The resistor and the thin film transistor shown in this embodiment are formed using the oxide semiconductor layer containing a high concentration of nitrogen. Thus, a driver circuit including the resistor and the thin film transistor has good dynamic characteristics. In addition, since the heat treatment is performed at 200° C. to 600° C., typically 250° C. to 500° C. in an atmosphere containing a substance which is a supply source of a hydrogen atom, hydrogen is introduced into the first oxide semiconductor layer containing a high concentration of nitrogen that is used for the resistor. Accordingly, a higher concentration of hydrogen is introduced into the first oxide semiconductor layer containing a high concentration of nitrogen than into the second oxide semiconductor layer containing a high concentration of nitrogen. As a result, the resistance of the first oxide semiconductor layer containing a high concentration of nitrogen can be made lower than that of the second oxide semiconductor layer containing a high concentration of nitrogen. Thus, the thin film transistor and the resistor do not need to be manufactured in different steps, which makes it possible to provide a driver circuit manufactured in a smaller number of steps.

Embodiment 3

In this embodiment, a resistor and a thin film transistor that are manufactured using the oxide semiconductor layer described in Embodiment 1 and the oxide semiconductor layer containing a high concentration of nitrogen described in Embodiment 2 will be described with reference to FIGS. 18A to 18C and FIGS. 19A and 19B. Note that FIGS. 18A to 18C and FIGS. 19A and 19B illustrate cross-sectional structures of the resistor and the thin film transistor, which are taken along the dotted line A-B and the dotted line C-D in FIG. 8.

In this embodiment, specifically, a structure in which the oxide semiconductor layer containing a high concentration of nitrogen described in Embodiment 2 is used instead of the buffer layers described in Embodiment 1 will be described with reference to FIGS. 18A to 18C and FIGS. 19A and 19B.

Figure 18A:
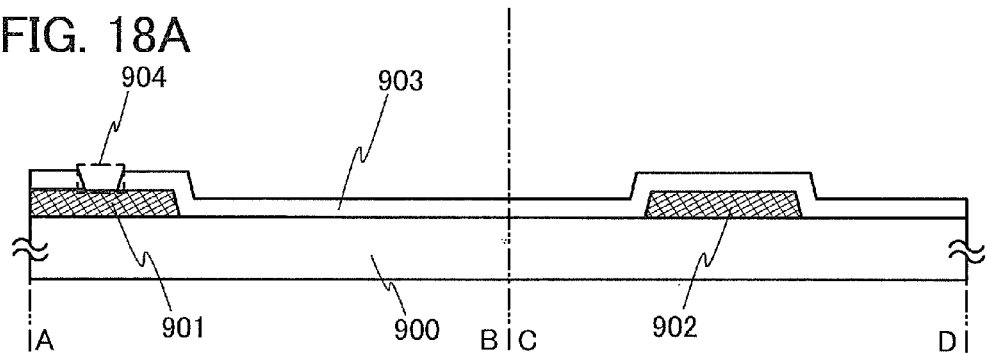
FIGS. 18A to 18C are diagrams illustrating an example of a manufacturing process of a driver circuit.

First, a first conductive film is deposited over the substrate 900. The first conductive film is deposited by a thin film deposition method typified by sputtering, vacuum evaporation, pulse laser deposition, ion plating, and the like. Then, a resist is formed over the first conductive film by a first photolithography step. Furthermore, the first conductive film is selectively etched using the resist as a mask, thereby forming the first wiring 901 and the gate terminal 902. Then, an insulating film is formed to cover the first wiring 901 and the gate terminal 902. The insulating film is deposited by a thin film deposition method typified by sputtering, vacuum evaporation, pulse laser deposition, ion plating, plasma CVD, and the like. Subsequently, a resist is formed over the insulating film by a second photolithography step. Furthermore, the insulating film is selectively etched using the resist as a mask, thereby forming the insulating layer 903 having the contact hole 904. Note that the first wiring 901, the gate terminal 902, and the insulating layer 903 can be made of the materials described in Embodiment 1; thus, the description of Embodiment 1 applies in this embodiment. FIG. 18A is a cross-sectional view in which these steps have been completed.

Then, an oxide semiconductor film 950 is deposited. The oxide semiconductor film 950 is deposited by a thin film deposition method typified by sputtering, vacuum evaporation, pulse laser deposition, ion plating, plasma CVD, and the like. In the case where the oxide semiconductor film 950 is deposited by sputtering, it is preferable to use a target made by sintering $In_2O_3$, $Ga_2O_3$, and ZnO. One of the deposition conditions by sputtering is as follows: a target made by mixing and sintering $In_2O_3$, $Ga_2O_3$, and ZnO (1:1:1) is used; pressure is 0.4 Pa; direct current (DC) power source is 500 W; the flow rate of argon gas is 10 sccm; and the flow rate of oxygen gas is 5 sccm.

Figure 18B:
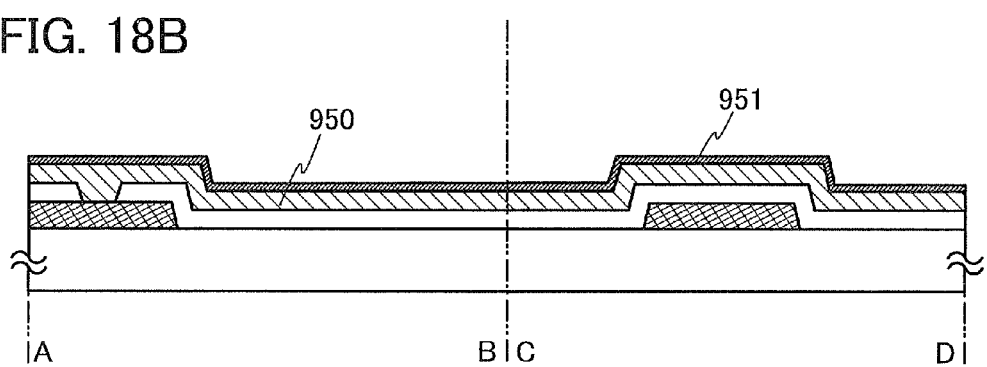

Then, an oxide semiconductor film 951 containing a high concentration of nitrogen is deposited. The oxide semiconductor film 951 containing a high concentration of nitrogen is deposited by a thin film deposition method typified by sputtering, vacuum evaporation, pulse laser deposition, ion plating, and the like. In the case where the oxide semiconductor film 951 is deposited by sputtering, it is preferable to use a target made by sintering $In_2O_3$, $Ga_2O_3$, and ZnO. The oxide semiconductor film 951 containing a high concentration of nitrogen is deposited by sputtering, for example, under the following conditions: a target made by mixing and sintering $In_2O_3$, $Ga_2O_3$, and ZnO (1:1:1) is used; pressure is 0.4 Pa; direct current (DC) power source is 500 W; the flow rate of argon gas is 35 sccm; and the flow rate of nitrogen gas is 5 sccm. FIG. 18B is a cross-sectional view in which these steps have been completed.

Figure 18C:
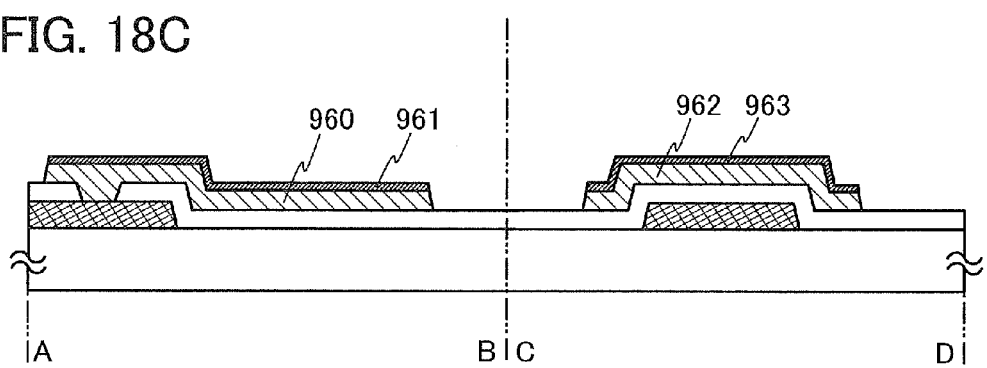

Then, a resist is formed over the oxide semiconductor film 951 containing a high concentration of nitrogen by a third photolithography step. Furthermore, the oxide semiconductor film 950 and the oxide semiconductor film 951 containing a high concentration of nitrogen are selectively etched using the resist as a mask, thereby forming a stack of a first oxide semiconductor layer 960 and a first oxide semiconductor layer 961 containing a high concentration of nitrogen, and a stack of a second oxide semiconductor layer 962 and a second oxide semiconductor layer 963 containing a high concentration of nitrogen. FIG. 18C is a cross-sectional view in which these steps have been completed.

At this time, heat treatment is performed at 200° C. to 600° C., typically 250° C. to 500° C. in an atmosphere containing a substance which is a supply source of a hydrogen atom. For example, the heat treatment is performed at 350° C. for one hour. As the atmosphere containing a substance which is a supply source of a hydrogen atom, a mixed atmosphere of hydrogen and a rare gas such as argon can be used.

Nitrogen in the oxide semiconductor layer has the effect of preventing atoms forming the oxide semiconductor layer from tightly filling the film, and of promoting diffusion and solid dissolution of hydrogen in the film. Accordingly, the heat treatment allows hydrogen to be introduced into the first oxide semiconductor layer 961 containing a high concentration of nitrogen and the second oxide semiconductor layer 963 containing a high concentration of nitrogen. As a result, the resistance of the first oxide semiconductor layer 961 containing a high concentration of nitrogen and the second oxide semiconductor layer 963 containing a high concentration of nitrogen can be reduced.

Figure 19A:
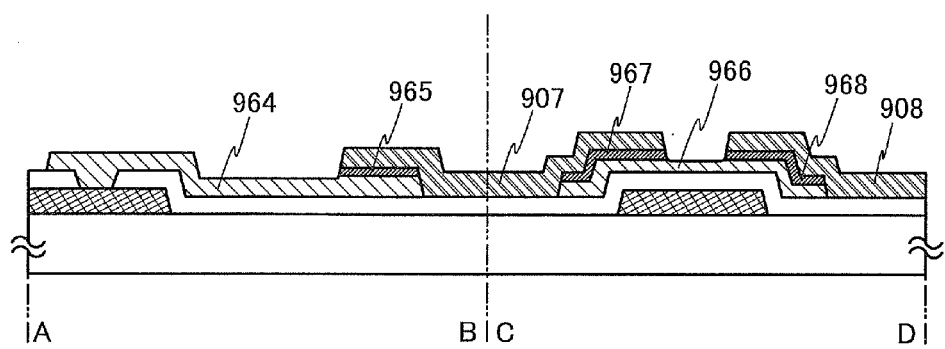
FIGS. 19A and 19B are diagrams illustrating an example of a manufacturing process of a driver circuit.

Then, a second conductive film is deposited. The second conductive film is deposited by a thin film deposition method typified by sputtering, vacuum evaporation, pulse laser deposition, ion plating, and the like. Then, a resist is formed over the second conductive film by a fourth photolithography step. Furthermore, the second conductive film is selectively etched using the resist as a mask, thereby forming the second wiring 907 and the third wiring 908. Note that the second wiring 907 and the third wiring 908 can be made of the materials described in Embodiment 1; thus, the description of Embodiment 1 applies in this embodiment. In this etching step, the oxide semiconductor layer containing a high concentration of nitrogen in a region that does not overlap the second wiring 907 and the third wiring 908 is etched to be removed. In addition, part of the oxide semiconductor layer in that region is also etched to form oxide semiconductor layers 964 and 966 and oxide semiconductor layers 965, 967, and 968 containing a high concentration of nitrogen. FIG. 19A is a cross-sectional view in which these steps have been completed.

Then, a silicon oxide film is deposited by sputtering. For example, the silicon oxide film can be deposited using silicon as a target and using a sputtering gas containing argon and oxygen. Alternatively, the silicon oxide film can be deposited using silicon oxide as a target and using argon as a sputtering gas. Subsequently, a resist is formed over the silicon oxide film by a fifth photolithography step. Furthermore, the silicon oxide film is selectively etched using the resist as a mask, thereby forming the silicon oxide layer 909.

Figure 19B:
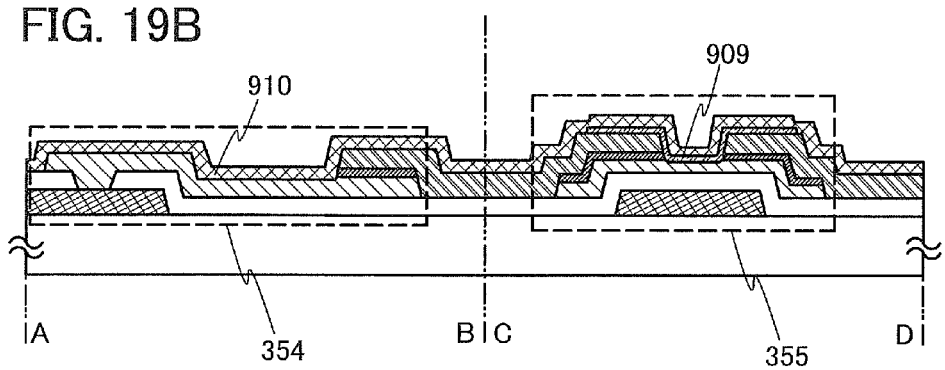

Then, the silicon nitride layer 910 serving as a passivation film is deposited. The silicon nitride layer 910 is formed by plasma CVD using a gas containing a hydrogen compound such as silane ($SiH_4$) and ammonia ($NH_3$). Through the above steps, the resistor 354 and the thin film transistor 355 are formed. FIG. 19B is a cross-sectional view in which these steps have been completed.

In the resistor 354 and the thin film transistor 355 shown in this embodiment, the oxide semiconductor layers 965, 967, and 968 containing a high concentration of nitrogen, into which hydrogen is introduced and which have a low resistance, are formed between the oxide semiconductor layers and the wiring layers that are conductors. Accordingly, a better contact than a Schottky junction can be made between the oxide semiconductor layers and the wiring layers, and thermally stable operation can be achieved. In addition, by providing the oxide semiconductor layers 967 and 968 containing a high concentration of nitrogen in the thin film transistor 355, good mobility can be maintained even at a high drain voltage.

Note that the aforementioned manufacturing process shows an example in which heat treatment for introducing hydrogen into the oxide semiconductor layer containing a high concentration of nitrogen is conducted after the etching step of the oxide semiconductor layer. However, the heat treatment may be conducted at any time after deposition of the oxide semiconductor film containing a high concentration of nitrogen and before deposition of the second conductive film. For example, the heat treatment can be conducted in the subsequent step of deposition of the oxide semiconductor film containing a high concentration of nitrogen.

Although the cross-sectional structure of the resistor corresponding to the line A-B in FIG. 8 is shown in this embodiment, the oxide semiconductor layer may have a meander shape as illustrated in FIG. 9 and FIG. 10. In addition, as illustrated in FIG. 10, the wiring layers may be formed over the both ends of the oxide semiconductor layer containing a high concentration of nitrogen.

In this embodiment, the cross-sectional structure of the channel-etched thin film transistor is shown; however, a channel-stop thin film transistor can also be used. Furthermore, although the inverted staggered thin film transistor is shown in this embodiment, a coplanar thin film transistor can also be used.

The resistor and the thin film transistor described in this embodiment are formed using the oxide semiconductor layer and the oxide semiconductor layer containing a high concentration of nitrogen. Accordingly, a driver circuit including the resistor and the thin film transistor has good dynamic characteristics. Moreover, the silicon nitride layer formed by plasma CVD using a gas containing a hydrogen compound such as silane ($SiH_4$) and ammonia ($NH_3$) is provided on and in direct contact with the first oxide semiconductor layer used for the resistor, and the silicon nitride layer is provided over the second oxide semiconductor layer used for the thin film transistor with the silicon oxide layer serving as a barrier layer interposed therebetween. Therefore, a higher concentration of hydrogen is introduced into the first oxide semiconductor layer in direct contact with the silicon nitride layer containing a high concentration of hydrogen than into the second oxide semiconductor layer. As a result, the resistance of the first oxide semiconductor layer can be made lower than that of the second oxide semiconductor layer. Thus, the thin film transistor and the resistor do not need to be manufactured in different steps, which makes it possible to provide a driver circuit manufactured in a smaller number of steps.

Embodiment 4

In this embodiment, an example of a structure of a driver circuit including a shift register formed by a dynamic circuit will be described with reference to FIGS. 20A to 20C.

Figure 20A:
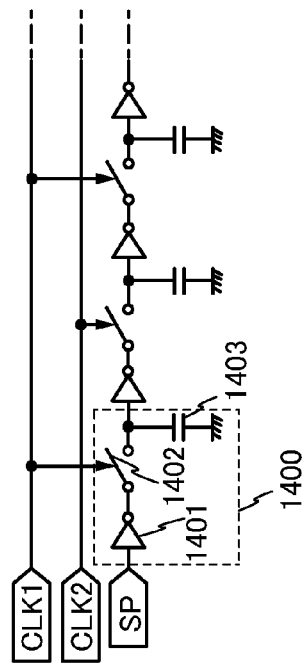
FIGS. 20A and 20B are circuit diagrams illustrating an example of a structure of a driver circuit, and 20C is an example a timing chart of the driver circuit.

A pulse output circuit 1400 illustrated in FIG. 20A includes an inverter circuit 1401 to which a start pulse (SP) is input from an input terminal, a switch 1402 one terminal of which is connected to an output terminal of the inverter circuit 1401, and a capacitor 1403 connected to the other terminal of the switch 1402. Note that the switch 1402 in the pulse output circuit of an odd-numbered stage is controlled to be on or off by a first clock signal (CLK1), and the switch 1402 in the pulse output circuit of an even-numbered stage is controlled to be on or off by a second clock signal (CLK2).

Figure 20B:
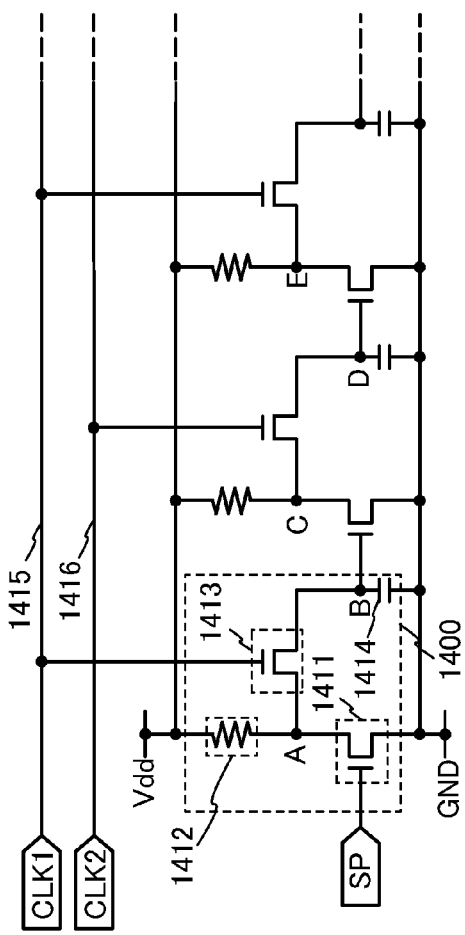

FIG. 20B illustrates in detail a circuit structure of the pulse output circuit. The pulse output circuit 1400 includes thin film transistors 1411 and 1413, a resistor 1412, and a capacitor 1414. The pulse output circuit of the odd-numbered stage is connected to a wiring 1415 for supplying the first clock signal (CLK1), and the pulse output circuit of the even-numbered stage is connected to a wiring 1416 for supplying the second clock signal (CLK2). In the pulse output circuit 1400, the thin film transistor 1411 and the resistor 1412 correspond to the inverter circuit 1401 illustrated in FIG. 20A, which is an ERMOS circuit. The thin film transistor 1413 corresponds to the switch 1402 illustrated in FIG. 17A, and the capacitor 1414 corresponds to the capacitor 1403 illustrated in FIG. 20A. It is preferable that the thin film transistor 1413 be an enhancement-mode transistor like the thin film transistor 1411. By using an enhancement-mode transistor as a switch, the off-current of the transistor can be reduced, resulting in lower power consumption and reduction in the number of manufacturing steps.

Figure 20C:
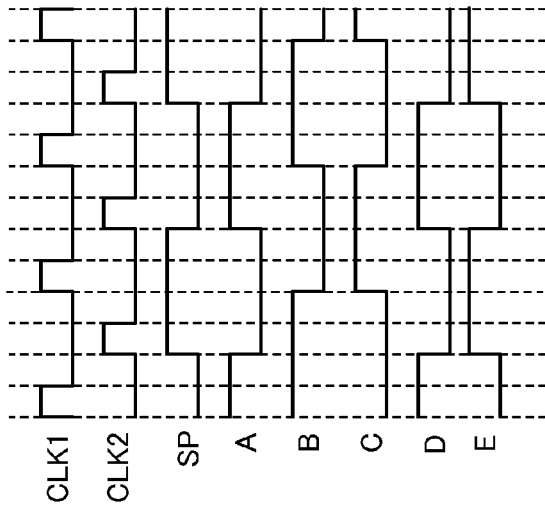

FIG. 20C is a timing chart showing the circuit operation of the circuits illustrated in FIGS. 20A and 20B. Note that in FIG. 20C, nodes in the circuit of FIG. 20B are denoted as nodes A to E for description.

First, operation will be described in which the first clock signal (CLK1) is at H level and the second clock signal (CLK2) is at L level.

An inverted signal of the start pulse (SP) appears at the node A. The signal at the node B is equal to that at the node A because the first clock signal (CLK1) is at H level. The signal at the node B is inverted by the inverter circuit in the subsequent stage, whereby an inverted signal of the signal at the node B appears at the node C. The signal at the node C does not appear at the node D because the second clock signal (CLK2) is at L level and the switch is closed.

Next, operation will be described in which the first clock signal (CLK1) is at L level and the second clock signal (CLK2) is at H level.

The signal at the node C transfers to the node D, and the signal at the node C is reflected in and appears at the node D. Then, the signal at the node D is inverted by the inverter circuit, whereby the inverted signal of the signal at the node D appears at the node E. After that, the first clock signal (CLK1) and the second clock signal (CLK2) are alternately at H level, so that the circuit illustrated in FIGS. 20A and 20B can function as a shift register.

A shift register including the pulse output circuits shown in this embodiment can be used for a source line driver circuit and a gate line driver circuit. Note that a signal may be output from the shift register via a logic circuit or the like so that a desired signal can be obtained.

The dynamic circuit described in this embodiment includes an ERMOS circuit. The ERMOS circuit includes the resistor and the thin film transistor shown in Embodiments 1 to 3. Accordingly, the dynamic circuit has good dynamic characteristics.

Embodiment 5

In this embodiment, an example of a display device including a protective circuit will be described with reference to FIG. 21 and FIGS. 22A and 22B.

Figure 21:
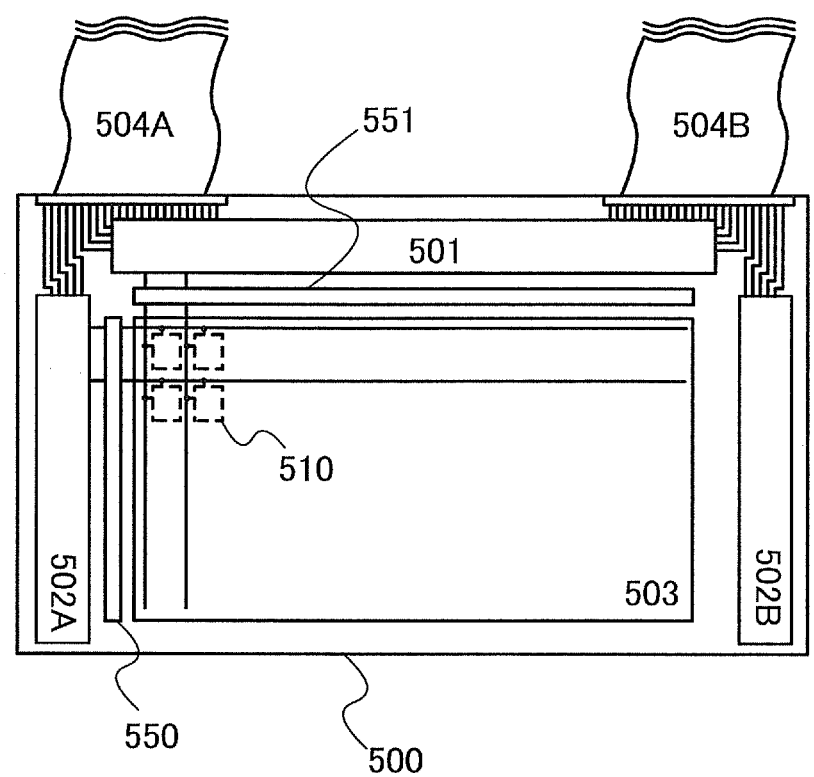
FIG. 21 is a diagram illustrating an example of a structure of a semiconductor device.

FIG. 21 illustrates an overall view of a display device. A source line driver circuit 501, a first gate line driver circuit 502A, a second gate line driver circuit 502B, and a pixel portion 503 are formed over a substrate 500. In the pixel portion 503, a part surrounded by a dotted frame 510 is one pixel. FIG. 21 illustrates an example where the first gate line driver circuit 502A and the second gate line driver circuit 502B are used as a gate line driver circuit; however, only one of them may be used as a gate line driver circuit. In the pixel of the display device, a display element is controlled by a thin film transistor. Signals (clock signals, start pulses, and the like) for driving the source line driver circuit 501, the first gate line driver circuit 502A, and the second gate line driver circuit 502B are input from the outside via flexible printed circuits (FPCs) 504A and 504B.

Furthermore, a protective circuit 550 is provided between the first gate line driver circuit 502A and the pixel portion, and a protective circuit 551 is provided between the source line driver circuit 501 and the pixel portion. The protective circuits 550 and 551 are connected to wirings extending from the first gate line driver circuit 502A and the source line driver circuit 501 to the pixel portion 503. By providing the protective circuits 550 and 551, even when noise is input together with signals or power supply voltages, it is possible to prevent malfunction of the circuit in the subsequent stage or degradation or destruction of a semiconductor element due to the noise. Thus, reliability and yield can be increased.

Next, a circuit structure of the protective circuits 550 and 551 illustrated in FIG. 21 will be specifically described with reference to FIGS. 22A and 22B.

Figure 22A:
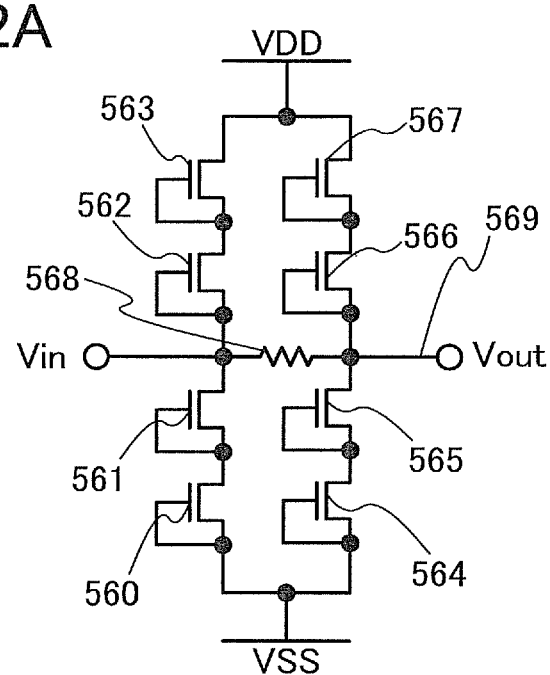
FIGS. 22A and 22B are circuit diagrams illustrating an example of a structure of a protective circuit.

A protective circuit illustrated in FIG. 22A includes diode-connected n-channel thin film transistors 560 to 567 functioning as a protective diode, and a resistor 568. Note that in the diode-connected n-channel thin film transistors, the side of a gate terminal and a first terminal is an anode and the side of a second terminal is a cathode.

The anode of the diode-connected n-channel thin film transistor 560 is connected to a wiring to which a low power supply potential VSS is supplied. The anode of the diode-connected n-channel thin film transistor 561 is connected to the cathode of the diode-connected n-channel thin film transistor 560, and the cathode of the diode-connected n-channel thin film transistor 561 is connected to a wiring 569. The anode of the diode-connected n-channel thin film transistor 562 is connected to the wiring 569. The anode of the diode-connected n-channel thin film transistor 563 is connected to the cathode of the diode-connected n-channel thin film transistor 562, and the cathode of the diode-connected n-channel thin film transistor 563 is connected to a high power supply potential VDD. The diode-connected n-channel thin film transistors 564 to 567 are connected in a manner similar to that of the diode-connected n-channel thin film transistors 560 to 563. The resistor 568 is connected in series to a terminal to which an input potential Vin is input and a terminal from which an output potential Vout is output.

Operation of the protective circuit illustrated in FIG. 22A will be described below.

When the input potential Vin from the driver circuit is extremely high, specifically, when the input potential Vin is higher than the sum of the high power supply potential VDD and the forward voltage drop of the diode-connected n-channel thin film transistors 562 and 563, the diode-connected n-channel thin film transistors 562 and 563 are turned on and the wiring 569 has a potential corresponding to the sum of the high power supply potential VDD and the forward voltage drop of the diode-connected n-channel thin film transistors 562 and 563.

On the other hand, when the input potential Vin from the driver circuit is extremely low, specifically, when the input potential Vin is lower than the difference between the low power supply potential VSS and the forward voltage drop of the diode-connected n-channel thin film transistors 560 and 561, the diode-connected n-channel thin film transistors 560 and 561 are turned on and the wiring 569 has a potential corresponding to the difference between the low power supply potential VSS and the forward voltage drop of the diode-connected n-channel thin film transistors 560 and 561.

Thus, the output potential Vout of the protective circuit can be kept within a given range.

Note that this embodiment shows the structure including the diode-connected n-channel thin film transistors 564 to 567 that are connected in a manner similar to that of the diode-connected n-channel thin film transistors 560 to 563. The diode-connected n-channel thin film transistors 564 to 567 can increase the number of current paths in the case where the input potential Vin from the driver circuit is extremely high or low. Accordingly, the reliability of the display device can be further increased.

In addition, the resistor 568 suppresses a rapid change in the potential of the wiring 569, thereby preventing degradation or destruction of a semiconductor element in the pixel portion.

Figure 22B:
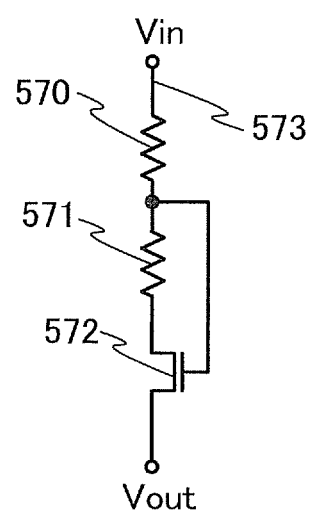

A protective circuit illustrated in FIG. 22B includes a resistor 570, a resistor 571, and a diode-connected n-channel thin film transistor 572. The resistor 570, the resistor 571, and the diode-connected n-channel thin film transistor 572 are connected in series to a wiring 573.

The resistor 570 and the resistor 571 can suppress a rapid change in the potential of the wiring 573, thereby preventing degradation or destruction of a semiconductor element in the pixel portion. Furthermore, the diode-connected n-channel thin film transistor 572 can prevent the flow of a reverse bias current through the wiring 573 due to a change in potential.

Note that when only the resistors are connected in series to the wiring, a rapid change in the potential of the wiring can be suppressed and degradation or destruction of a semiconductor element in the pixel portion can be prevented. Further, when only the diode-connected n-channel thin film transistor is connected in series to the wiring, a reverse bias current due to a change in potential can be prevented from flowing through the wiring.

Note that the structure of the protective circuit of this embodiment is not limited to those illustrated in FIGS. 22A and 22B. The circuit design can be modified as appropriate as long as the circuit operates similarly.

The protective circuit described in this embodiment includes the resistor and the thin film transistor shown in Embodiments 1 to 3. Accordingly, the protective circuit has good dynamic characteristics.

Embodiment 6

In this embodiment, an example of a light-emitting display device will be described as a semiconductor device including the resistor and the thin film transistor described in Embodiments 1 to 3. Here, a light-emitting display device including a light-emitting element utilizing electroluminescence is described. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Description is made here using an organic EL element as a light-emitting element.

The structure and operation of a pixel that can be used will be described. A pixel shown here includes an n-channel thin film transistor using an oxide semiconductor layer for a channel formation region.

Figure 23:
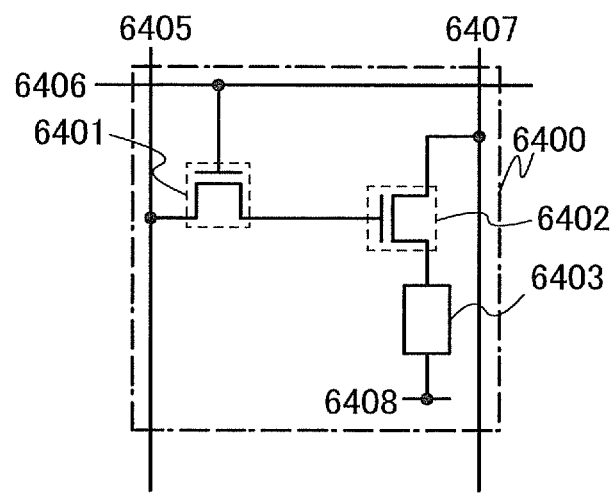
FIG. 23 is a circuit diagram illustrating an example of a structure of a pixel of a semiconductor device.

FIG. 23 is a diagram illustrating an example of a pixel structure. A pixel 6400 in FIG. 23 includes thin film transistors 6401 and 6402, and a light-emitting element 6403. A gate terminal of the thin film transistor 6401 is connected to a gate line 6406, and a first electrode thereof is connected to a source line 6405. A gate terminal of the thin film transistor 6402 is connected to a second terminal of the thin film transistor 6401, a first terminal of the thin film transistor 6402 is connected to a power supply line 6407, and a second terminal of the thin film transistor 6402 is connected to a first electrode (a pixel electrode) of the light-emitting element

6403. Note that the power supply line 6407 is set to a high power supply potential VDD.

A second electrode of the light-emitting element 6403 corresponds to a common electrode 6408. The common electrode 6408 is electrically connected to a common potential line provided over the same substrate. Note that the second electrode of the light-emitting element 6403 (the common electrode 6408) is set to a low power supply potential VSS. For example, GND or 0 V may be set as the low power supply potential VSS. The difference between the high power supply potential VDD applied to the power supply line 6407 and the low power supply potential VSS applied to the second electrode is applied to the light-emitting element 6403, whereby flow currents through the light-emitting element 6403 and the light-emitting element 6403 emits light. Thus, each potential is set so that the difference between the high power supply potential VDD and the low power supply potential VSS is equal to or higher than a forward threshold voltage of the light-emitting element 6403.

Next, a structure of the light-emitting element will be described with reference to FIGS. 24A to 24C. In this embodiment, the thin film transistor illustrated in FIG. 12A is used as a thin film transistor of a light-emitting display device; however, any other thin film transistors shown in Embodiments 1 to 3 can be used as the thin film transistor of the light-emitting display device shown in this embodiment.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure illustrated in FIG. 23 can be applied to a light-emitting element having any of these emission structures.

A light-emitting element having a top emission structure will be described with reference to FIG. 24A.

Figure 24A:
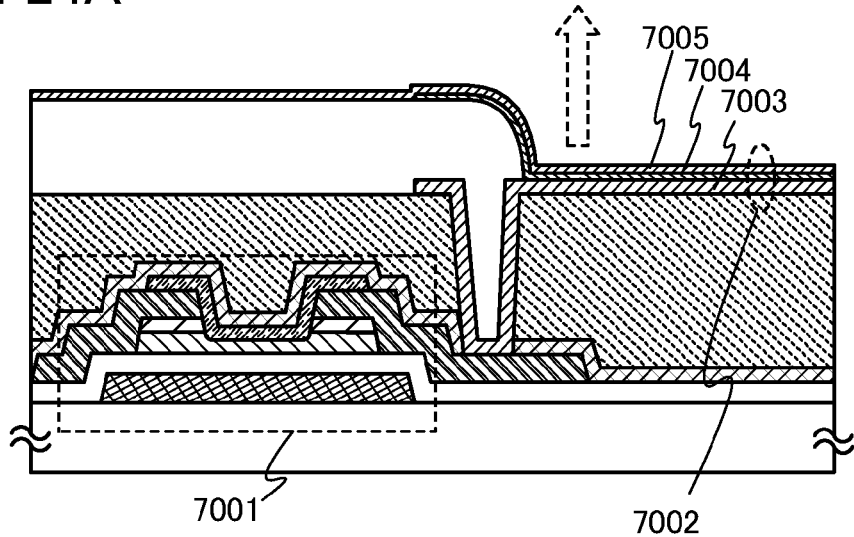
FIGS. 24A to 24C are diagrams each illustrating an example of a structure of a semiconductor device.
Figure 24B:
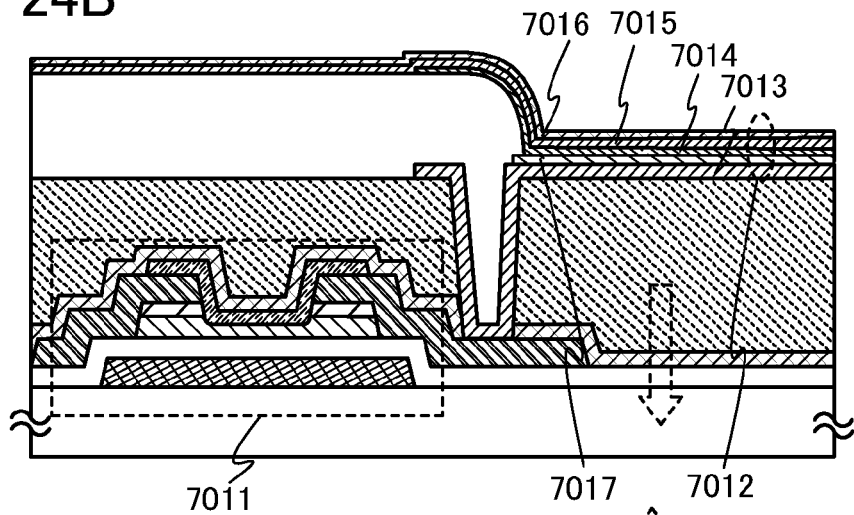
Figure 24C:
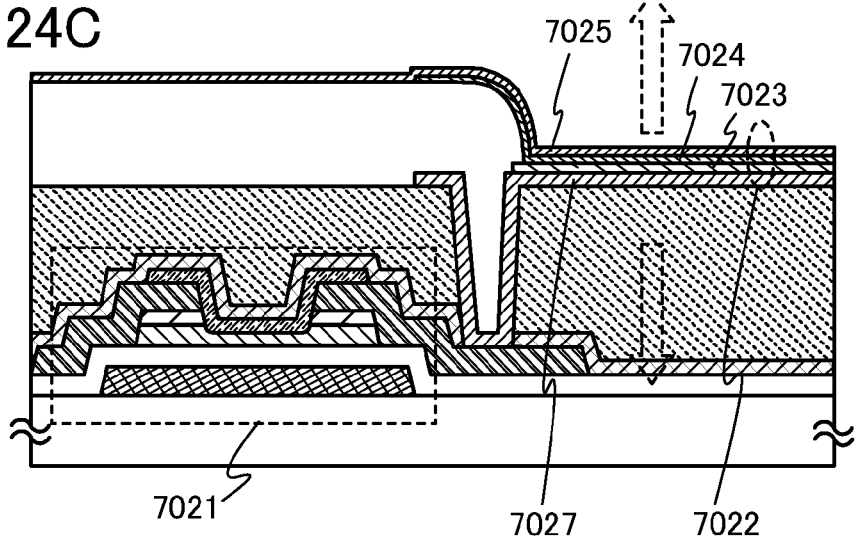

FIG. 24A is a cross-sectional view of a pixel in the case where a thin film transistor 7001 is of an n-type and light is emitted from a light-emitting element 7002 to an anode 7005 side. In FIG. 24A, a cathode 7003 of the light-emitting element 7002 is electrically connected to the thin film transistor 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, or AlLi is preferably used. The light-emitting layer 7004 may be formed using a single layer or a plurality of layers stacked. When the light-emitting layer 7004 is formed using a plurality of layers, an electron-injecting layer, an electron-transporting layer, a light-emitting layer, a hole-transporting layer, and a hole-injecting layer are stacked in this order over the cathode 7003. Not all of these layers need to be provided. The anode 7005 is made of a light-transmitting conductive material, and for example, the anode 7005 can be made of a conductive oxide having a light-transmitting property, such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

A region where the light-emitting layer 7004 is sandwiched between the cathode 7003 and the anode 7005 corresponds to the light-emitting element 7002. In the case of the pixel illustrated in FIG. 24A, light is emitted from the light-emitting element 7002 to the anode 7005 side as indicated by an arrow.

Next, a light-emitting element having a bottom emission structure will be described with reference to FIG. 24B. FIG. 24B is a cross-sectional view of a pixel in the case where a thin film transistor 7011 is of an n-type and light is emitted from a light-emitting element 7012 to a cathode 7013 side. In FIG. 24B, the cathode 7013 of the light-emitting element 7012 is formed over a light-transmitting conductive layer 7017 that is electrically connected to the thin film transistor 7011, and a light-emitting layer 7014 and an anode 7015 are stacked in this order over the cathode 7013. A light-blocking layer 7016 for reflecting or blocking light may be formed to cover the anode 7015 when the anode 7015 has a light-transmitting property. Various materials can be used for the cathode 7013, like in the case of FIG. 24A, as long as they are conductive materials having a low work function. Note that the cathode 7013 is formed to a thickness that can transmit light (preferably, approximately 5 nm to 30 nm). For example, an aluminum film with a thickness of 20 nm can be used as the cathode 7013. As in the case of FIG. 24A, the light-emitting layer 7014 may be formed using either a single layer or a plurality of layers stacked. The anode 7015 is not required to transmit light, but can be made of a light-transmitting conductive material like in the case of FIG. 24A. As the light-blocking layer 7016, a metal which reflects light can be used for example; however, it is not limited to a metal film. For example, a resin to which black pigments are added can also be used.

A region where the light-emitting layer 7014 is sandwiched between the cathode 7013 and the anode 7015 corresponds to the light-emitting element 7012. In the case of the pixel illustrated in FIG. 24B, light is emitted from the light-emitting element 7012 to the cathode 7013 side as indicated by an arrow.

Next, a light-emitting element having a dual emission structure will be described with reference to FIG. 24C. In FIG. 24C, a cathode 7023 of a light-emitting element 7022 is formed over a light-transmitting conductive layer 7027 that is electrically connected to a thin film transistor 7021, and a light-emitting layer 7024 and an anode 7025 are stacked in this order over the cathode 7023. Like in the case of FIG. 24A, the cathode 7023 can be made of a variety of conductive materials as long as they have a low work function. Note that the cathode 7023 is formed to a thickness that can transmit light. For example, a film of Al having a thickness of 20 nm can be used as the cathode 7023. Like in FIG. 24A, the light-emitting layer 7024 may be formed using either a single layer or a plurality of layers stacked. The anode 7025 can be made of a light-transmitting conductive material like in the case of FIG. 24A.

A region where the cathode 7023, the light-emitting layer 7024, and the anode 7025 overlap each other corresponds to the light-emitting element 7022. In the case of the pixel illustrated in FIG. 24C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

Figure 25A:
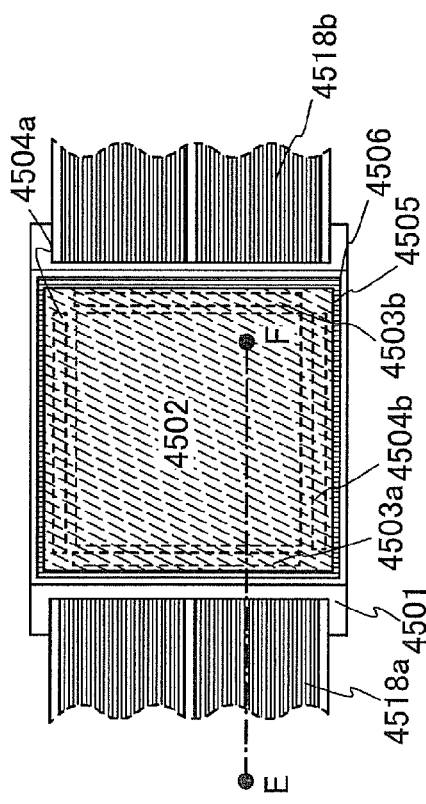
FIGS. 25A and 25B are diagrams illustrating an example of a structure of a semiconductor device.
Figure 25B:
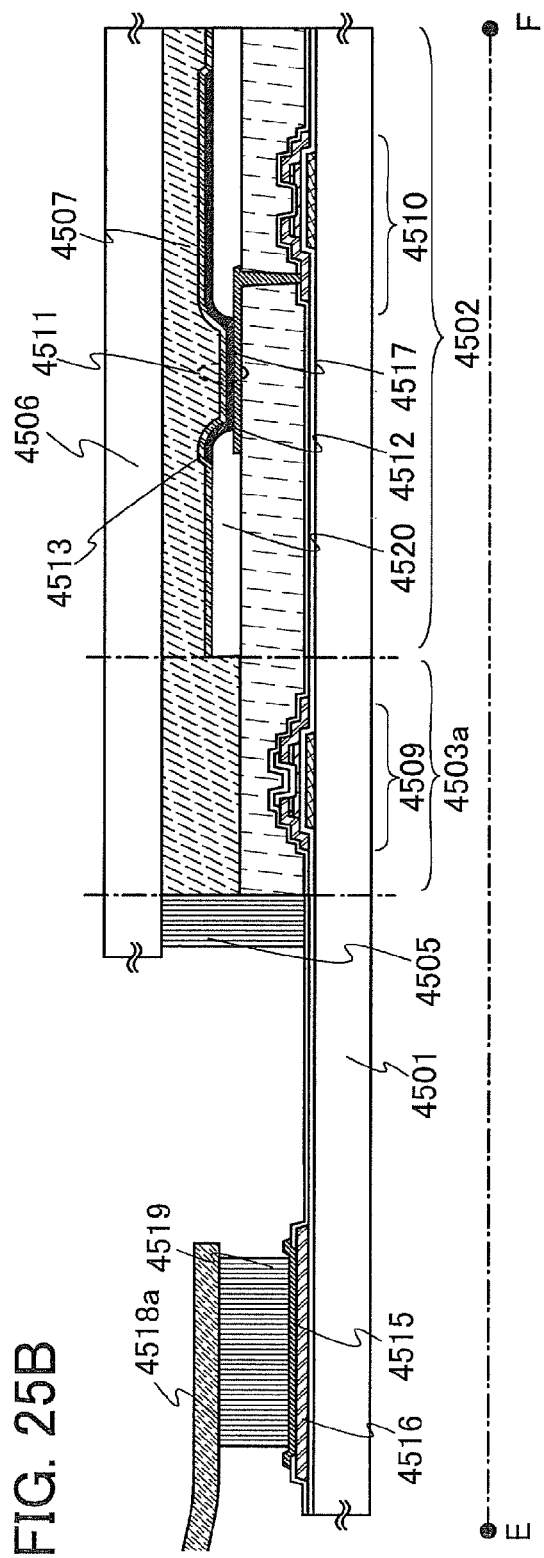

Next, the appearance and a cross section of a light-emitting display panel (also referred to as a light-emitting panel), which is one embodiment of the display device, will be described with reference to FIGS. 25A and 25B. FIG. 25A is a top view of a panel in which a thin film transistor and a light-emitting element are sealed between a first substrate and a second substrate with a sealant. FIG. 25B is a cross-sectional view taken along a line E-F of FIG. 25A.

A sealant 4505 is provided to surround a pixel portion 4502, source line driver circuits 4503a and 4503b, and gate line driver circuits 4504a and 4504b, which are provided over a first substrate 4501. In addition, a second substrate 4506 is provided over the pixel portion 4502, the source line driver circuits 4503a and 4503b, and the gate line driver circuits 4504a and 4504b. Accordingly, the pixel portion 4502, the source line driver circuits 4503a and 4503b, and the gate line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

Like the source line driver circuits 4503a and 4503b, and the gate line driver circuits 4504a and 4504b, the pixel portion 4502 formed over the first substrate 4501 includes a thin film transistor manufactured using an oxide semiconductor. In FIG. 25B, a thin film transistor 4510 included in the pixel portion 4502 and a thin film transistor 4509 included in the source line driver circuit 4503a are illustrated as an example.

In this embodiment, the thin film transistor illustrated in FIG. 12A is used as the thin film transistors 4509 and 4510; however, any other thin film transistors shown in Embodiments 1 to 3 can be used as the thin film transistor of the light-emitting display device shown in this embodiment.

Reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stacked structure shown in this embodiment, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be made of a photosensitive material and include an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering into the light-emitting element 4511. As the protective film, a silicon nitride layer, a silicon nitride oxide layer, a DLC layer, or the like can be formed.

A variety of signals and potentials are supplied to the source line driver circuits 4503a and 4503b, the gate line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The source line driver circuits 4503a and 4503b and the gate line driver circuits 4504a and 4504b may be mounted as driver circuits formed over a substrate separately prepared. Alternatively, only the source line driver circuits or part thereof, or only the gate line driver circuits or part thereof may be separately formed and mounted. This embodiment is not limited to the structure illustrated in FIGS. 25A and 25B.

The light-emitting display device described in this embodiment includes the resistor and the thin film transistor shown in Embodiments 1 to 3. Accordingly, the light-emitting display device has good dynamic characteristics.

Embodiment 7

In this embodiment, an example of electronic paper will be described as a semiconductor device including the resistor and the thin film transistor shown in Embodiments 1 to 3.

Figure 26:
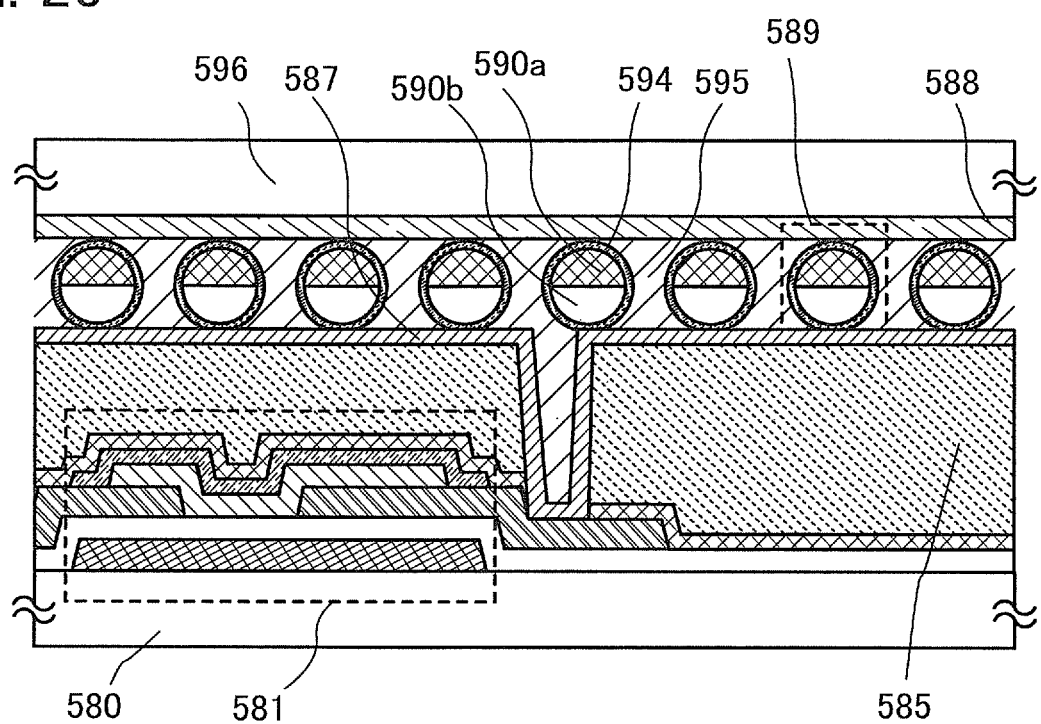
FIG. 26 is a diagram illustrating an example of a structure of a semiconductor device.

FIG. 26 illustrates active matrix electronic paper. The electronic paper in FIG. 26 uses a twisting ball display system. The twisting ball display system refers to a method in which spherical particles each colored in black and white are used for a display element and arranged between a first electrode layer and a second electrode layer which are electrode layers, and a potential difference is generated between the first electrode layer and the second electrode layer to control the orientation of the spherical particles, so that display is performed.

The thin film transistor 581 provided over a first substrate 580 is a bottom-gate thin film transistor. A first terminal or a second terminal of the thin film transistor 581 is in contact with a first electrode layer 587 through an opening formed in an insulating layer 585, whereby the thin film transistor 581 is electrically connected to the first electrode layer 587. Spherical particles 589 each having a black region 590a, a white region 590b, and a cavity 594 around the regions which is filled with liquid are provided between the first electrode layer 587 and a second electrode layer 588, and further sandwiched between the first substrate 580 and the second substrate 596. A space around the spherical particles 589 is filled with a filler 595 such as a resin (see FIG. 26). In this embodiment, the first electrode layer 587 corresponds to the pixel electrode and the second electrode layer 588 corresponds to the common electrode.

Instead of the twisting ball, an electrophoretic element can also be used. A microcapsule having a diameter of about 10 μm to 200 μm, in which transparent liquid, positively charged white microparticles, and negatively charged black microparticles are encapsulated, is used. In the microcapsule that is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

The electronic paper described in this embodiment includes the resistor and the thin film transistor shown in Embodiments 1 to 3. Accordingly, the electronic paper has good dynamic characteristics.

Embodiment 8

In this embodiment, examples of an electronic appliance will be described as a semiconductor device including the resistor and the thin film transistor shown in Embodiments 1 to 3.

Figure 27A:
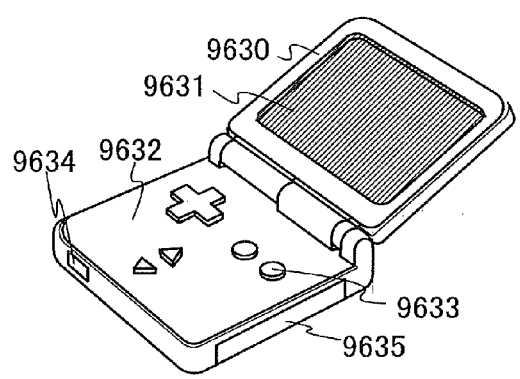
FIGS. 27A to 27C are views each illustrating an example of a semiconductor device.

FIG. 27A illustrates a portable game machine that includes a housing 9630, a display portion 9631, a speaker 9632, operation keys 9633, a connection terminal 9634, a recording medium reading portion 9635, and the like. The portable game machine illustrated in FIG. 27A can have various functions such as a function of reading a program or data stored in a recording medium to display on the display portion, and a function of sharing information with another portable game machine by wireless communication. Note that the functions of the portable game machine illustrated in FIG. 27A are not limited to those, and the portable game machine can have other various functions.

Figure 27B:
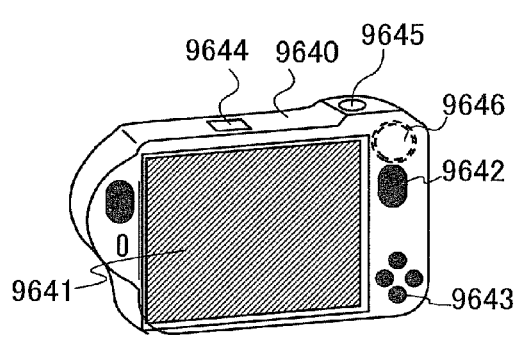

FIG. 27B illustrates a digital camera that includes a housing 9640, a display portion 9641, a speaker 9642, operation keys 9643, a connection terminal 9644, a shutter button 9645, an image receiving portion 9646, and the like. The digital camera having a television reception function illustrated in FIG. 27B can have various functions such as a function of photographing still images and moving images; a function of automatically or manually adjusting the photographed images; a function of obtaining various kinds of information from an antenna; a function of storing the photographed images or the information obtained from the antenna; and a function of displaying the photographed images or the information obtained from the antenna on the display portion. Note that the functions of the digital camera having a television reception function illustrated in FIG. 27B are not limited to those, and the digital camera having a television reception function can have other various functions.

Figure 27C:
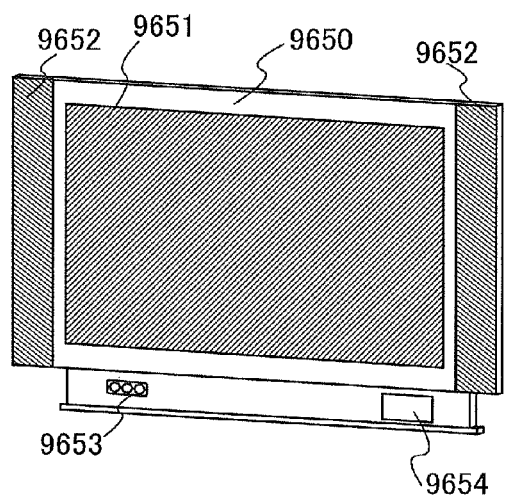

FIG. 27C illustrates a television receiver that includes a housing 9650, a display portion 9651, speakers 9652, operation keys 9653, a connection terminal 9654, and the like. The television receiver illustrated in FIG. 27C can have various functions such as a function of converting radio waves for television into an image signal; a function of converting an image signal into a signal which is suitable for display; and a function of converting the frame frequency of an image signal. Note that the functions of the television receiver illustrated in FIG. 27C are not limited to those, and the television receiver can have other various functions.

Figure 28A:
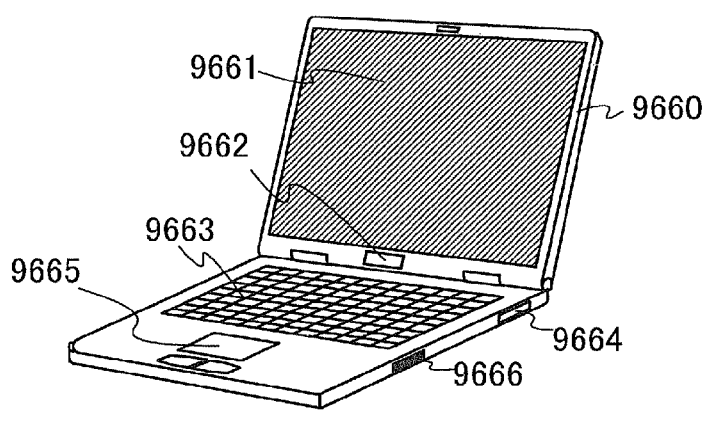
FIGS. 28A and 28B are views each illustrating an example of a semiconductor device.
Figure 28B:
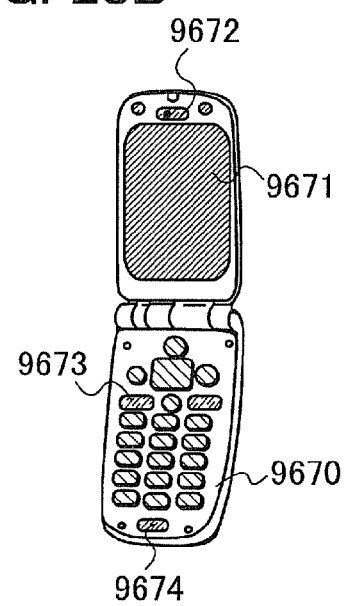

FIG. 28B illustrates a computer that includes a housing 9660, a display portion 9661, a speaker 9662, operation keys 9663, a connection terminal 9664, a pointing device 9665, an external connection port 9666, and the like. The computer illustrated in FIG. 28A can have various functions such as a function of displaying various kinds of information (e.g., still images, moving images, and text images) on the display portion; a function of controlling processing by various kinds of software (programs); a communication function such as wireless communication or wire communication; a function of connecting with various computer networks by using the communication function; and a function of transmitting or receiving various kinds of data by using the communication function. Note that the functions of the computer illustrated in FIG. 28A are not limited to those, and the computer can have other various functions.

FIG. 28B illustrates a cellular phone that includes a housing 9670, a display portion 9671, a speaker 9672, operation keys 9673, a microphone 9674, and the like. The cellular phone illustrated in FIG. 28B can have various functions such as a function of displaying various kinds of information (e.g., still images, moving images, and text images); a function of displaying a calendar, a date, the time, and the like on the display portion; a function of operating or editing the information displayed on the display portion; and a function of controlling processing by various kinds of software (programs). Note that the functions of the cellular phone illustrated in FIG. 28B are not limited to those, and the cellular phone can have other various functions.

The electronic appliances described in this embodiment each include the resistor and the thin film transistor shown in Embodiments 1 to 3. Accordingly, the electronic appliances have good dynamic characteristics.

This application is based on Japanese Patent Application serial No. 2008-327998 filed with Japan Patent Office on Dec. 24, 2008, the entire contents of which are hereby incorporated by reference.

What is claimed is:

1. A method for manufacturing a semiconductor device including a transistor and a passive element connected to the transistor, the method comprising the steps of:
   forming an oxide semiconductor layer over a substrate;
   etching part of the oxide semiconductor layer to form a first layer for the transistor and a second layer for the passive element;
   forming an oxide insulating layer over and in contact with the first layer and the second layer;
   etching part of the oxide insulating layer to expose at least a portion of the second layer; and
   forming a nitride insulating layer over and in contact with the oxide insulating layer,
   wherein the nitride insulating layer contacts the exposed portion of the second layer so that hydrogen contained in the nitride insulating layer is introduced into the exposed portion and resistance of the exposed portion is lowered.

2. The method according to claim 1, wherein the nitride insulating layer is a silicon nitride layer formed by a plasma CVD method.

3. The method according to claim 1, wherein the passive element is a resistor element.

4. The method according to claim 1, wherein the oxide semiconductor layer comprises indium and zinc.

5. The method according to claim 1, wherein the semiconductor device is a display device.

6. A method for manufacturing a semiconductor device including a transistor and a passive element connected to the transistor, the method comprising the steps of:
forming an oxide semiconductor layer over a substrate, the oxide semiconductor layer including a first region for the transistor and a second region for the passive element;
forming an oxide insulating layer over and in contact with the oxide semiconductor layer in the first region and the second region;
etching part of the oxide insulating layer to expose at least a portion of the oxide semiconductor layer in the second region; and
forming a nitride insulating layer over and in contact with the oxide insulating layer,
wherein the nitride insulating layer contacts the exposed portion of the oxide semiconductor layer in the second region so that hydrogen contained in the nitride insulating layer is introduced into the exposed portion and resistance of the exposed portion is lowered.

7. The method according to claim 6, wherein the nitride insulating layer is a silicon nitride layer formed by a plasma CVD method.

8. The method according to claim 6, wherein the passive element is a resistor element.

9. The method according to claim 6, wherein the oxide semiconductor layer comprises indium and zinc.

10. The method according to claim 6, wherein the semiconductor device is a display device.

11. A method for manufacturing a semiconductor device including a transistor and a passive element connected to the transistor, the method comprising the steps of:
forming a gate electrode over a substrate;
forming a gate insulating film over the gate electrode;
forming an oxide semiconductor layer over the gate insulating film;
etching part of the oxide semiconductor layer to form a first layer for the transistor and a second layer for the passive element, wherein the first layer overlaps the gate electrode;
forming a source electrode and a drain electrode connected to the first layer;
forming an oxide insulating layer over and in contact with the first layer, the source electrode, and the drain electrode, and the second layer;
etching part of the oxide insulating layer to expose at least a portion of the second layer;
forming a nitride insulating layer over and in contact with the oxide insulating layer; and
forming a pixel electrode connected to the semiconductor device,
wherein the nitride insulating layer contacts the exposed portion of the second layer so that hydrogen contained in the nitride insulating layer is introduced into the exposed portion and resistance of the exposed portion is lowered.

12. The method according to claim 11, wherein the nitride insulating layer is a silicon nitride layer formed by a plasma CVD method.

13. The method according to claim 11, wherein the passive element is a resistor element.

14. The method according to claim 11, wherein the oxide semiconductor layer comprises indium and zinc.

15. The method according to claim 11, wherein the semiconductor device is a display device.

16. A method for manufacturing a semiconductor device including a transistor and a passive element connected to the transistor, the method comprising the steps of:
forming a gate electrode over a substrate;
forming a gate insulating film over the gate electrode;
forming an oxide semiconductor layer including a first region for the transistor and a second region for the passive element over the gate insulating film, wherein the first region overlaps the gate electrode;
forming a source electrode and a drain electrode connected to the oxide semiconductor layer in the first region;
forming an oxide insulating layer over and in contact with the oxide semiconductor layer in the first region, the source electrode, and the drain electrode, and the oxide semiconductor layer in the second region;
etching part of the oxide insulating layer to expose at least a portion of the oxide semiconductor layer in the second region;
forming a nitride insulating layer over and in contact with the oxide insulating layer; and
forming a pixel electrode connected to the semiconductor device,
wherein the nitride insulating layer contacts the exposed portion of the oxide semiconductor layer in the second region so that hydrogen contained in the nitride insulating layer is introduced into the exposed portion and resistance of the exposed portion is lowered.

17. The method according to claim 16, wherein the nitride insulating layer is a silicon nitride layer formed by a plasma CVD method.

18. The method according to claim 16, wherein the passive element is a resistor element.

19. The method according to claim 16, wherein the oxide semiconductor layer comprises indium and zinc.

20. The method according to claim 16, wherein the semiconductor device is a display device.

* * * * *